(12) United States Patent
Wee et al.

(10) Patent No.: US 12,066,878 B2
(45) Date of Patent: Aug. 20, 2024

(54) ADAPTIVE HOST BUS POWER CONTROL

(71) Applicant: Infineon Technologies AG, Neubiberg (DE)

(72) Inventors: Tue Fatt David Wee, Singapore (SG); Chunyan Zhang, Singapore (SG)

(73) Assignee: Infineon Technologies AG, Neubiberg (DE)

( * ) Notice: Subject to any disclaimer, the term of this patent is extended or adjusted under 35 U.S.C. 154(b) by 123 days.

(21) Appl. No.: 17/826,532

(22) Filed: May 27, 2022

(65) Prior Publication Data
US 2022/0390998 A1 Dec. 8, 2022

(30) Foreign Application Priority Data

Jun. 2, 2021 (EP) ..................................... 21177310

(51) Int. Cl.
*G06F 1/26* (2006.01)
*G11C 7/10* (2006.01)
*H03K 17/687* (2006.01)

(52) U.S. Cl.
CPC ........... *G06F 1/266* (2013.01); *H03K 17/687* (2013.01); *G11C 7/10* (2013.01)

(58) Field of Classification Search
CPC .......... G06F 21/44; G06F 21/85; G06F 1/266; G06F 13/4072; G06F 1/26; G06F 13/38; H03K 17/687; G11C 7/10; G05B 19/0423; G05B 2219/25257
See application file for complete search history.

(56) References Cited

U.S. PATENT DOCUMENTS

| | | | | |
|---|---|---|---|---|
| 7,765,420 B2* | 7/2010 | Heath | ..................... | G06F 1/189 |
| | | | | 713/330 |
| 11,720,505 B2* | 8/2023 | Aichriedler | ............. | G06F 7/588 |
| | | | | 710/106 |
| 2004/0049619 A1* | 3/2004 | Lin | ..................... | G06F 13/4282 |
| | | | | 710/105 |
| 2005/0044431 A1* | 2/2005 | Lang | ..................... | H04L 12/10 |
| | | | | 713/300 |
| 2008/0298385 A1* | 12/2008 | Ng | ..................... | H04L 12/40032 |
| | | | | 370/445 |
| 2012/0039319 A1* | 2/2012 | Moore | ............... | H05K 7/20836 |
| | | | | 370/338 |
| 2015/0303992 A1* | 10/2015 | Kim | ................... | G06K 7/10247 |
| | | | | 455/41.1 |
| 2015/0312025 A1* | 10/2015 | Chen | ................... | H04L 25/4906 |
| | | | | 375/289 |
| 2016/0142201 A1* | 5/2016 | Weiner | .................. | G06F 1/3206 |
| | | | | 375/354 |
| 2016/0301394 A1* | 10/2016 | Leutgeb | ......... | H03K 19/018521 |
| 2017/0153996 A1 | 6/2017 | Ross et al. | | |
| 2017/0255250 A1 | 9/2017 | Ngo et al. | | |
| 2017/0345513 A1* | 11/2017 | Zheng | ..................... | G06F 13/14 |
| 2019/0385057 A1* | 12/2019 | Litichever | ............... | H04L 63/14 |

(Continued)

*Primary Examiner* — Faisal M Zaman
(74) *Attorney, Agent, or Firm* — Murphy, Bilak & Homiller, PLLC

(57) ABSTRACT

According to various aspects, a controller may be configured to: control a transmission over a single-wire interface of an instruction corresponding to a high-current operation; and control an electrical behavior of a charging path to provide current at the single-wire interface during a time period corresponding to an execution of the instructed high-current operation.

18 Claims, 9 Drawing Sheets

(56) References Cited

U.S. PATENT DOCUMENTS

| | | | |
|---|---|---|---|
| 2021/0110022 A1* | 4/2021 | Russell | G06F 21/44 |
| 2022/0216708 A1* | 7/2022 | Wee | H02J 1/06 |
| 2023/0047577 A1* | 2/2023 | Bolton | H04B 1/40 |

* cited by examiner

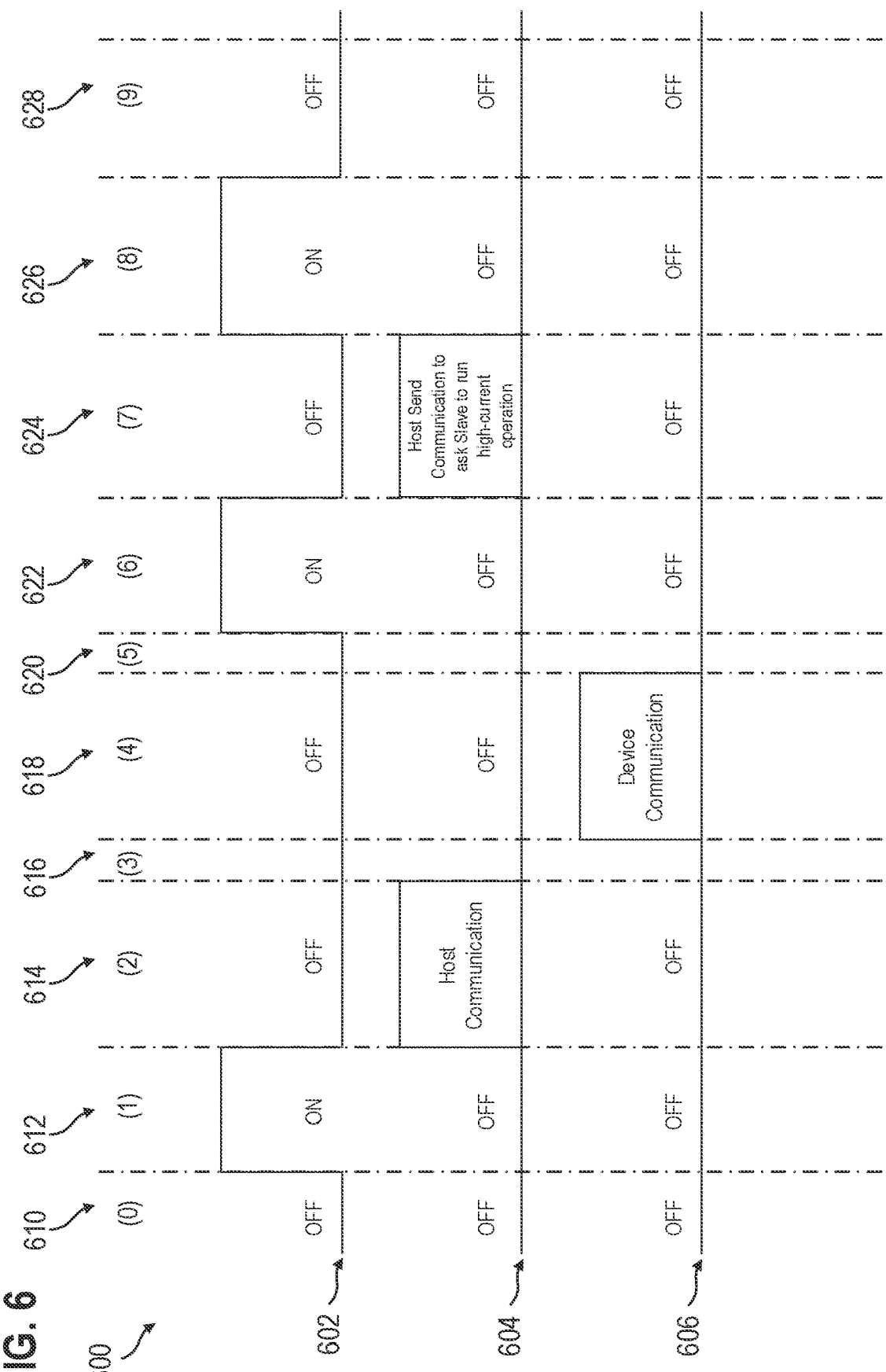

ADAPTIVE HOST BUS POWER CONTROL

TECHNICAL FIELD

Various aspects relate to a controller for use in a single-wire interface and methods thereof, e.g. a method of operating a single-wire interface.

BACKGROUND

In general, various devices have been developed for single-wire implementations. In a single-wire interface, a host (master) device is connected with one or more single-wire (slave) devices via a single-wire connection over which data and power may be transferred. A single-wire device is capable of receiving data and power via the single-wire connection, and is capable of transmitting data to the host device via the single-wire connection, thus providing bidirectional communication. A single-wire device may be configured to provide various functionalities such as authentication, sensing, and data storage, as examples.

SUMMARY

According to an embodiment of a controller, the controller comprises analog and/or digital circuitry configured to: control a transmission over a single-wire interface of an instruction corresponding to a high-current operation; and control an electrical behavior of a charging path to provide current at the single-wire interface during a time period corresponding to an execution of the instructed high-current operation.

According to an embodiment of a device, the device comprises: the controller of claim 1; a voltage supply terminal; and a first field-effect transistor coupled between the single-wire interface and the voltage supply terminal.

According to an embodiment of a system, the system comprises: a first device configured according to claim 7; and a second device, wherein the first device and the second device are connected to one another over the single-wire interface.

According to an embodiment of a computer program product, the computer program product comprises one or more non-transitory computer readable media storing a computer program operable, when executed by a controller, to direct the controller to execute a method of operating a single-wire interface, the computer program comprising: program instructions to control a transmission over the single-wire interface of an instruction corresponding to a high-current operation; and program instructions to control an electrical behavior of a charging path to provide current at the single-wire interface during a time period corresponding to an execution of the instructed high-current operation.

According to an embodiment of a method of operating a single-wire interface, the method comprises: controlling the transmission over a single-wire interface of an instruction corresponding to a high-current operation; and controlling an electrical behavior of a charging path to provide current at the single-wire interface during a time period corresponding to an execution of the instructed high-current operation.

Those skilled in the art will recognize additional features and advantages upon reading the following detailed description, and upon viewing the accompanying drawings.

BRIEF DESCRIPTION OF THE DRAWINGS

In the drawings, like reference characters generally refer to the same parts throughout the different views. The drawings are not necessarily to scale, emphasis instead generally being placed upon illustrating the principles of the invention. In the following description, various aspects of the invention are described with reference to the following drawings, in which:

FIG. 6 shows a time diagram illustrating an operation of a system including a first device and a second device, according to various aspects;

DETAILED DESCRIPTION

Figure 1:
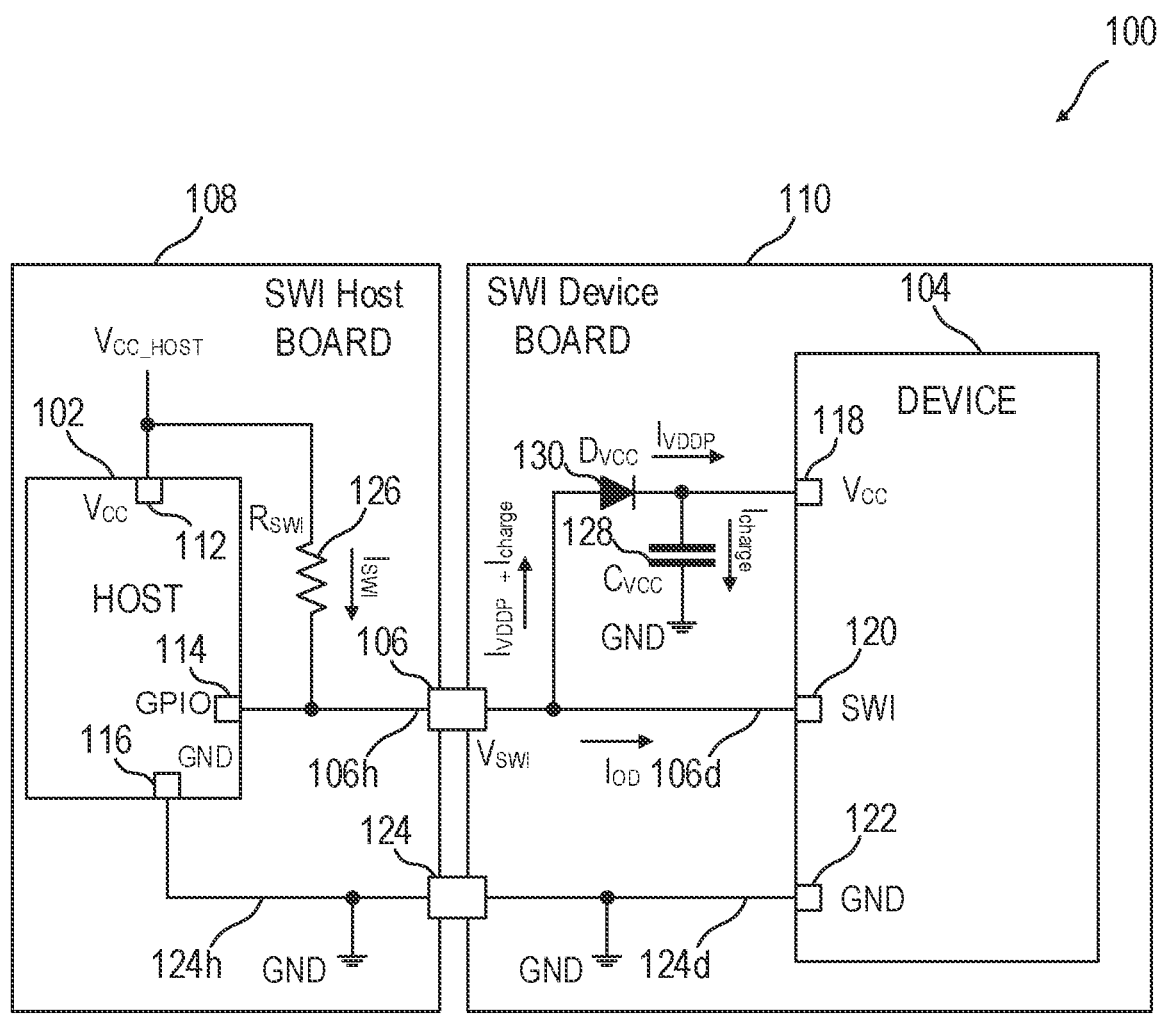
FIG. 1 shows schematically a single-wire system including a host device and a single-wire device, according to various aspects.

The following detailed description refers to the accompanying drawings that show, by way of illustration, specific details and aspects in which the invention may be practiced. These aspects are described in sufficient detail to enable those skilled in the art to practice the invention. Other aspects may be utilized and structural, logical, and electrical changes may be made without departing from the scope of the invention. The various aspects are not necessarily mutually exclusive, as some aspects may be combined with one or more other aspects to form new aspects. Various aspects are described in connection with methods and various aspects are described in connection with devices (e.g., a controller, a host device, a single-wire device, or a single-wire system). However, it may be understood that aspects described in connection with methods may similarly apply to devices, and vice versa.

The terms "at least one" and "one or more" may be understood to include any integer number greater than or equal to one, i.e. one, two, three, four, [ . . . ], etc. The term "a plurality" or "a multiplicity" may be understood to include any integer number greater than or equal to two, i.e. two, three, four, five, [ . . . ], etc.

The phrase "at least one of" with regard to a group of elements may be used herein to mean at least one element from the group consisting of the elements. For example, the phrase "at least one of" with regard to a group of elements may be used herein to mean a selection of: one of the listed elements, a plurality of one of the listed elements, a plurality of individual listed elements, or a plurality of a multiple of listed elements.

The term "single-wire" may be used herein as commonly known in the art to describe a configuration, e.g. of a system, in which an individual connecting element is used to provide data and operating power, for example to a device (or to multiple devices) connected thereto. The terms "single-wire" may be used herein in relation, for example, to a single-wire interface (SWI), a single-wire system, a single-wire device, a single-wire host, a single-wire signal, a single-wire connection, a single-wire protocol, and a single-wire terminal, to describe that the respective element or construct is suitable for use in a configuration in which data and power are supplied via an individual connecting element. In some aspects, the term "single-wire" may be used to describe a configuration or an arrangement even in case an additional connection may be present, e.g. even in case an additional connecting element connecting a single-wire host and a single-wire device with one another may be present, e.g. to provide a reference signal (e.g., a common ground, illustratively a current return path).

The terms "host", "host device", "single-wire host", "single-wire host device", "master" or "master device" may be used herein to describe a device (e.g., in a single-wire system) configured to instruct the operation(s) of one or more other devices (e.g., one or more slave devices, for example one or more single-wire devices). A host may be understood as a device configured to govern the transmission and the reception of data, e.g. a host may be configured to transmit data to the one or more other devices and may be configured to request the transmission of data from one or more of the other devices. A host may be understood as a device configured to instruct the operation of the one or more other devices (e.g., providing instructions prompting the execution of one or more operations). Illustratively, the host may be understood as a master device to whose instructions the one or more slave devices respond. In some aspects, a host device may include a controller, such as a microcontroller, a field programmable gate array, and the like.

The terms "slave" or "slave device" may be used herein to describe a device (e.g., in a single-wire system) configured to be instructed by another device (e.g., configured to receive instructions from the other device, for example from a host device). A slave device may be understood as a device configured to receive instructions and to respond to the received instructions (e.g., without performing any active data transmission if not prompted). In some aspects, a slave device may be configured to transmit data (e.g., various types of information), e.g. upon request from the host device. Illustratively, the slave device may be understood as a device responding to instructions of a host (master) device. In some aspects, a slave device may be configured to carry out a predefined or pre-programmed operation, such as transmitting authentication data, transmitting data stored in a memory of the slave device, sensing a physical quantity (e.g., temperature, humidity, and the like), as examples. In some aspects, a slave device does not include any power supply or power source. Illustratively, a slave device, in some aspects, does not include any built-in or integrated source of electrical power, e.g. any voltage source or current source. Examples of slave devices may include (non-exhaustive list) temperature sensors, battery monitors, devices for mobile battery applications, authenticators for determining if the host is communicating with an authenticated original product such as batteries and other replacement parts, non-volatile RAM, and silicon serial numbers.

In the context of the present description, a "single-wire device" may be described as an example of slave device, e.g. as an example of a slave device in a single-wire system. It is however understood that the aspects described herein in relation to a "single-wire device" or "single-wire slave device" may apply in an analogous manner to other types of slave devices, e.g. not in a single-wire system. Illustratively, the aspects described herein may apply to any (e.g., slave) device that receives communication and power (e.g., from a host) at a same terminal.

The term "single-wire connection" may be used herein to describe an element connecting a host device and a single-wire device with one another. In some aspects, a single-wire connection may be an individual electrically conductive path (e.g., including an electrically conductive wire, an electrically conductive trace, and the like) connecting a host device and a single-wire device with one another. In some aspects, a single-wire connection may be understood as a bus connected to a host device and to which one or more single-wire devices are connected. In some aspects, a single-wire connection may be used to transfer data between a host device and a single-wire device (e.g., in a bidirectional manner). In some aspects, a single-wire connection may be used to deliver electrical power to a single-wire device connected to it (and to the host connected to it). A single-wire device may draw electrical power from a single-wire connection to which it is connected. Illustratively, a single-wire connection may be used to deliver a signal configured to provide data and power to a single-wire device (in some aspects, to each single-wire device) connected to the single-wire connection. A single-wire connection may be understood, in some aspects, as a communication line (or bus) which is also used to power a device connected thereto. In some aspects, a single-wire connection may include an open drain bus to which one or more devices may be connected (e.g., a host device and one or more single-wire devices). In some aspects, a single-wire connection may be considered to encompass also one or more electrically conductive elements of a device connected thereto, illustratively one or more elements via which the device is connected to the single-wire bus, such as a conductive line (or trace), and the like.

It is understood that a "single-wire connection" is described herein as an example of a connection between a host device and a slave device, e.g. in a single-wire system. The aspects described herein in relation to a "single-wire connection" may be in general understood to apply to a connection between two devices via which data and power are transmitted (e.g., from the host device to the slave device).

The term "connected" may be used herein with respect to terminals, integrated circuit elements, devices, and the like, to mean electrically connected, which may include a direct connection or an indirect connection, wherein an indirect connection may only include additional structures in the current path that do not influence the substantial functioning of the described circuit or device. The term "electrically conductively connected" that is used herein to describe an electrical connection between one or more terminals, devices, regions, contacts, etc., may be understood as an electrically conductive connection with, for example, ohmic behavior, e.g. provided by a metal or degenerate semiconductor in absence of p-n junctions in the current path. The term "electrically conductively connected" may be also referred to as "galvanically connected".

The terms "path", "electrical path", or "electrically conductive path" may be used herein to describe an electrically conductive connection between two or more elements. A path may be understood, in some aspects, as an electrically conductive line (or trace) along which a signal (in some aspects, a current or a voltage) may travel, e.g. from a first element connected to the path to a second element connected to the path or vice versa. The term path may describe a direct path or an indirect path, wherein an indirect path may only include additional structures in the path that do not influence the substantial functioning of the described circuit or device (illustratively, that do not influence the signal traveling along the path).

The term "signal" may be used herein to describe an analog signal or a digital signal. In some aspects, a signal may be an electrical signal, e.g. a current or a voltage. In some aspects, a signal may be an electrical signal configured to provide data, e.g. an electrical signal modulated to encode data in the signal. In some aspects, a first level of the signal (e.g., a first voltage level, or a first current level, for example a high voltage level, or a high current level) may be associated with a logic "1", and a second level of the signal (e.g., a second voltage level, or a second current level, for example a low voltage level, or a low current level) may be associated with a logic "0". It is however understood that the definition of logic "1" and logic "0" and of the type of signal modulation associated thereto may be arbitrary (e.g., other examples of modulation may include the signal amplitude, the signal frequency, the signal period, etc.). A level of a signal may also be referred to herein as a state of the signal. A high voltage level or a high current level of a signal may be understood as a signal having a voltage above a voltage threshold or a current above a current threshold, respectively. A low voltage level or a low current level of a signal may be understood as a signal having a voltage below a voltage threshold or a current below a current threshold, respectively. Only as a numerical example, a high voltage level may be 1 V and a low voltage level may be 0 V. As another numerical example, a high current level may be 500 mA and a low current level may be 0 mA.

As used herein, a signal that is "indicative of", "representative of" or "representing" a value or other information (e.g., an instruction) may be a digital or analog signal that encodes or otherwise communicates the value or other information in a manner that can be decoded by and/or cause a responsive action in a component receiving the signal (e.g., in a slave device receiving instructions from a host device, or in a host device receiving data from a slave device).

The term "reference voltage" may be used herein to denote a base voltage for a device or a system (e.g., for a host device, or for a single-wire system). With respect to a device or system, the reference voltage may be also referred to as ground (GND) voltage, ground potential, virtual ground voltage, or zero volts (0 V).

The terms "processor", "controller", or "processing circuitry" may be used interchangeably herein to describe any kind of technological entity that allows handling of data. The data may be handled according to one or more specific functions executed by the controller. Further, a controller as used herein may be understood as any kind of circuit, e.g., any kind of analog or digital circuit. A controller may thus be or include an analog circuit, digital circuit, mixed-signal circuit, logic circuit, processor, microprocessor, Central Processing Unit (CPU), Graphics Processing Unit (GPU), Digital Signal Processor (DSP). Field Programmable Gate Array (FPGA), integrated circuit, Application Specific Integrated Circuit (ASIC), etc., or any combination thereof. Any other kind of implementation of the respective functions, which will be described below in further detail, may also be understood as a controller. It is understood that any two (or more) of the controllers detailed herein may be realized as a single entity with equivalent functionality or the like, and conversely that any single controller detailed herein may be realized as two (or more) separate entities with equivalent functionality or the like. In some aspects, a controller may also be understood as a "cloud-based" implementation. A device including a controller may be understood, in some aspects, as a device being in communication with a controller (illustratively, with a processing entity), e.g. via a network connection. Illustratively, the controller may be arranged in a separate system (external to the device) with which the device may be communicatively coupled, such that the handling of data and the generation of information, instructions, etc., may be carried out in the controller and then communicated to the device.

As used herein, "memory" is understood as a computer-readable medium (e.g., a non-transitory computer-readable medium) in which data or information can be stored for retrieval. References to "memory" included herein may thus be understood as referring to volatile or non-volatile memory, including random access memory (RAM), read-only memory (ROM), flash memory, solid-state storage, magnetic tape, hard disk drive, optical drive, 3D XPoint™, among others, or any combination thereof. Registers, shift registers, processor registers, data buffers, among others, are also embraced herein by the term memory.

The term "terminal" may be used herein to describe a location (e.g., a point) or structure of a device or of an element of the device at which a signal (e.g., an analog signal, for example a current or a voltage) may be provided and/or to which another device or element may be connected. Illustratively, a terminal may be a location or a structure that is electrically conductively connected with the device or the element (e.g., with a host device, with a slave device, with a single-wire connection, with a field-effect transistor, and the like). A terminal may also be referred to herein as port, pin, contact, or contact point.

In the context of the present description, the term "operable" in relation to a device (e.g., in relation to a controller) may be used to describe that the device may carry out a function independently (e.g., without external instructions) or under control of another device (e.g., another module or circuit). A first device operable to carry out a function may be capable of carrying out the function completely by itself and/or may be capable of being operated by a second device to carry out the function. The second device may be configured to operate the first device, e.g. to provide instructions to the first device to carry out the function, illustratively, a device operable to carry out a function, with respect to a device configured to carry out the function, may provide the possibility of being controlled by another device for carrying out the function.

Various aspects may be based on the realization that in a conventional host device-slave device system, the power made available to the slave device may be insufficient to support various types of operations that may be implemented in the slave device, due to the increasing trend to use lower voltages for supplying a host device.

Various aspects may be related to an adaptive control of the power made available at a single-wire interface (e.g., at a single-wire connection), to ensure that a slave device may draw sufficient power to carry out a desired operation (e.g., a high-current operation). Various aspects may be related to controlling the electrical power (in some aspects, the current) made available at the single-wire interface as a function of an operation to be carried out (e.g., in the slave device). Illustratively, various aspects may be related to an adaptive power control configured to allow power to be made available at the single-wire interface during or in anticipation of a high power consumption (e.g., during or in anticipation of the execution of an operation corresponding to a high power consumption).

In the context of the present description, the term "power" is used as commonly understood in the art to describe an amount of electrical energy over time. An operation carried out in a device (e.g., in a slave device) may be associated with a power consumption, e.g. with an energy consumption in a certain time period. The energy consumed by the operation may remain the same (in different executions of the operation), and the power consumption may vary depending on the time period in which the operation is carried out (e.g., the power consumption may increase for a time period of decreasing duration, and vice versa). A power made available at a device (e.g., at a slave device, such as a single-wire device) or at an interface (e.g., at a single-wire interface, for example at a single-wire connection) may include a current provided at the device or interface and a voltage (a potential) provided at the device or interface. For example, the voltage may be fixed (e.g., the device or interface may be coupled with a source supplying a constant voltage, e.g. a supply voltage or a reference voltage), and the current may be varied (e.g., increased or decreased) to increase or decrease the amount of power made available at the device or interface.

A slave device may draw a certain amount of power from a single-wire interface, as a function of the operation that the slave device is carrying out. Various aspects may be related to adaptively controlling the amount of power made available at the single-wire interface (e.g., the amount of current provided at the single-wire interface) as a function of an expected amount of power that the slave device will draw from the single-wire interface for executing an operation. Various aspects may be illustratively related to an Adaptive Host Bus Power control that is activities-based, as a function of the current demand of the device for indirect power mode/bus powered application.

Various aspects may be related to a controller configured to implement the adaptive power control described herein. The controller may be configured to control the availability of power (e.g., the provision of current) at a single-wire interface (e.g., at a single-wire connection) in an adaptive manner, e.g. as a function of an operation to be carried out that may demand a high power consumption (illustratively, a power consumption greater than a predefined threshold). The controller may be configured to allow current to be delivered at the single-wire interface during or in anticipation of a high-power operation (e.g., carried out or to be carried out by a slave device), to ensure that the high-power operation may be executed. A high-power operation may also be understood as a high-current operation, e.g. considering a fixed voltage (a fixed potential). In some aspects, the controller may be operable to implement the adaptive power control described herein.

According to various aspects, a controller may be configured to: control an electrical behavior of a charging path to provide current at a single-wire interface during or in anticipation of an execution of an operation associated with (e.g., corresponding to) a current consumption greater than a predefined threshold (illustratively, a current consumption in a predefined current range).

According to various aspects, a controller may be configured to: control a transmission over a single-wire interface of an instruction corresponding to a high-current operation; and control an electrical behavior of a charging path to provide current at the single-wire interface during a time period corresponding to an execution of the instructed high-current operation.

According to various aspects, a method of operating a single-wire interface may be provided, the method including: controlling an electrical behavior of a charging path to provide current at a single-wire interface during or in anticipation of an execution of an operation associated with a current consumption greater than a predefined threshold.

According to various aspects, a method of operating a single-wire interface may be provided, the method including: controlling the transmission over a single-wire interface of an instruction corresponding to a high-current operation; and controlling an electrical behavior of a charging path to provide current at the single-wire interface during a time period corresponding to an execution of the instructed high-current operation.

FIG. 1 shows schematically a single-wire system 100 including a host device 102 (a master device) and a single-wire device 104 (a slave device) according to various aspects. Illustratively, the host device 102 and the single-wire device 104 may form a single-wire interface, e.g. the host device 102 and the single-wire device 104 may be connected to one another via a single-wire connection 106. The single-wire device 104, may be configured to receive data and power via the single-wire connection 106, as described in further detail below.

The host device 102 and the single-wire device 104 may include a respective substrate 108, 110. Illustratively, the host device 102 and the single-wire device 104 may be disposed on the respective substrate 108, 110 (e.g., mounted on or integrated in the respective substrate 108, 110). In some aspects, the substrate 108, 110 may be a board (also referred to as single-wire host board or single-wire device board, respectively), e.g. a printed circuit board. The single-wire connection 106 may be understood to include respective conductive elements (e.g., conductive lines) on the substrate 108 of the host device 102 (e.g., the conductive element 106h) and on the substrate 110 of the single-wire device 104 (e.g., the conductive element 106d).

In some aspects, the host device 102 may include one or more terminals, each associated with a respective function or operation. The host device 102 may include a supply terminal 112 at which supply power (e.g., a supply voltage $V_{CC\_HOST}$) is provided, an input/output terminal 114 (e.g., a general purpose input/output (GPIO) terminal), which may be used for communication (e.g., with the single-wire device 104), and a ground terminal 116, at which a reference voltage (e.g., a ground voltage) may be provided. Illustratively, the ground terminal 116 may be connected to a reference voltage source, e.g. to ground.

In some aspects, the single-wire device 104 may include one or more terminals, each associated with a respective function or operation. The single-wire device 104 may include a supply terminal 118 at which supply power is provided to drive the single-wire device 104 (as described in further detail below), an input/output terminal 120 (also referred to as a single-wire terminal), which may be used for communication with the host device 102, and a ground terminal 122, at which a reference voltage (e.g., a ground voltage) may be provided. Illustratively, the ground terminal 122 may be connected to a reference voltage source, e.g. to ground. In some aspects, the ground terminal 122 of the single-wire device 104 and the ground terminal 116 of the host device 102 may be connected to one another, e.g. via a ground connection 124. The ground connection 124 may provide a return path for the current flowing between the host device 102 and the single-wire device 104. The ground connection 124 may include respective conductive elements (e.g., conductive lines) on the substrate 108 of the host device 102 (e.g., the conductive element 124h) and on the substrate 110 of the single-wire device 104 (e.g., the conductive element 124d).

The host device 102 and the single-wire device 104 may be configured to exchange data via the single-wire connection 106. The host device 102 may be configured to transmit data (e.g., instructions) to the single-wire device 104, and may be configured to receive data (e.g., a response, various types of information) from the single-wire device 104. The single-wire device 104 may be configured to receive data from the host device 102, and to transmit data to the host device 102.

The single-wire device 104 may be configured to be powered by the signal provided via the single-wire interface (e.g., via the single-wire connection 106). The single-wire device 104 may be configured to draw its operating power from the signal provided via the single-wire connection 106 (e.g., from a current $I_{SWI}$ provided via the single-wire connection 106, illustratively provided by the supply voltage $V_{CC\_HOST}$ over the pull-up resistor 126). Where the single-wire connection 106 is used for both communication and power transmission, the single-wire device 104 may be coupled to an external capacitor 128 ($C_{VCC}$). The capacitor 128 ($C_{VCC}$) is configured to store charge for powering the single-wire device 104 when power supply from the host device 102 is not available (e.g. when the single-wire connection 106 is being used for communications, or when the signal at the single-wire connection 106 is pulled low). The capacitor 128 may be connected to the single-wire connection 106 (and to the supply terminal 118 and to ground) and it may be charged by the power provided via the single-wire connection 106 (e.g., by a current $I_{charge}$ flowing into the capacitor 128). The capacitor 128 may be configured such that the single-wire device 104 may operate (by obtaining operating power from the capacitor 128) even in case the signal at the single-wire connection 106 is pulled low. The powering of the single-wire device 104 by the charge stored in the capacitor 128 may be referred to as indirect power mode.

The single-wire device 104 may include a diode 130 ($D_{VCC}$), e.g. a rectifier, configured to prevent a discharge of the capacitor 128. The diode 130 may be configured (e.g., disposed) such that it allows a current flow in the direction from the single-wire connection 106 to the capacitor 128 and such that it substantially prevents a current flow in the direction from the capacitor 128 to the single-wire connection 106. Illustratively, the diode 130 may be configured such that the capacitor 128 is not discharged in case the signal at the single-wire connection 106 is pulled low.

Various aspects of the present disclosure may be based on the realization that in a configuration as illustrated in FIG. 1 the power available to a single-wire device (e.g., to the single-wire device 104) may be insufficient to support various types of operations that may be implemented therein (e.g., operations that have a greater energy demand). With advancement in process technology, there is an increasing trend to use lower voltage for supplying a host device (e.g., to use lower supply voltages $V_{CC\_HOST}$). In such applications, the voltage at a supply terminal ($V_{CC}$) of the single-wire device may not be able to support its operation due to the voltage drop at the diode (the $D_{VCC}$ drop) and the voltage drop over the pull-up resistor ($R_{SWI}$). This consideration may apply to both small and large geometry process node, and may be more relevant in the case that the device is using a bigger geometry process node, such as 0.13 μm and above. Illustratively, the pull-up resistor ($R_{SWI}$) may be located at the host side for an open drain communication purpose, and the voltage drop across the pull-up resistor ($R_{SWI}$) may reduce the margin of the supply voltage ($V_{CC\_HOST}$) that may be applied at or used by the single-wire device. This condition may become worse in the case that the single-wire device is consuming higher current, e.g. in the case that the single-wire device is executing a high-current operation.

Various aspects may be related to a controller configured to implement adaptive power control at a single-wire interface. The controller described herein may be for use in a single-wire system (e.g., in the single-wire system 100 described in FIG. 1, in the single-wire system 500a, 500b, 500c described in further detail below), e.g. in a (host) device part of a single-wire system. Illustratively, the controller may be configured to implement adaptive host bus power control to adaptively control (at the host side) the power (e.g., the current) available at the single-wire interface as a function of an expected current consumption at the single-wire interface (e.g., an expected current consumption of another (slave) device connected to the single-wire interface).

The controller described herein may be configured in such a way that the power available at a single-wire interface is not static but rather adaptively reacts to an increase (or an expected increase) in power consumption (e.g., current consumption) at the single-wire interface. This adaptive control may allow a smooth operation of a single-wire system, ensuring that a (slave) device may draw sufficient power (e.g., may receive sufficient current) to carry out an operation or a range of operations. The configuration described herein may eliminate the need for additional power sources (e.g., charge pumps, which may increase the silicon area) and/or for additional terminals to be connected to additional power sources, thus providing a simpler fabrication process. The power control described herein may allow a lower voltage drop between a communication line and a supply terminal of the device, thus providing greater operating margin.

The controller may be described herein in the context of a single-wire configuration. In some aspects, the controller may be part of a host device, e.g. in a single-wire interface system. It is however understood that the aspects described herein are not limited to a host device, or more in general are not limited to a controller for use in a single-wire system, but may be applied to a variety of configurations and scenarios in which the adaptive power control may provide an improved operation of a device (e.g., may enable a wider range of operations).

Figure 2:
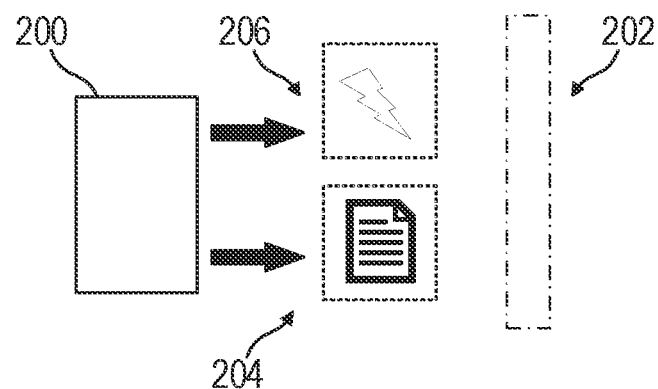
FIG. 2 shows schematically a controller, according to various aspects.

FIG. 2 shows schematically a controller 200 according to various aspects. In some aspects, the controller 200 may be configured for use in a single-wire system, e.g. for use in a first (host) device part of a single-wire system, as described in further detail below. The controller 200 may be configured to implement an adaptive power control at a single-wire interface 202. The single-wire interface 202 may be an interface between a first device (e.g., a host device) and a second device (or a plurality of second devices, e.g. one or more slave devices), as described in further detail below (see for example FIG. 5A to FIG. 5C). The single-wire interface 202 may be a bidirectional single-wire interface to enable communication in both directions (from the first device to the one or more second devices, and vice versa). In some aspects, the controller 200 may be or may include a transceiver.

The controller 200 may be configured to control an amount power available at the single-wire interface 202 in an adaptive manner, e.g. as a function of an expected power consumption at the single-wire interface 202 (e.g., an expected current consumption of a device connected to the single-wire interface 202). The controller 200 may be configured to enable current to be provided at the single-wire interface 202 during or in anticipation of an increased current consumption at the single-wire interface 202.

According to various aspects, the controller 200 may be configured to carry out (e.g., to instruct) a communication protocol including the adaptive power control described herein. The communication protocol may include any suitable communication protocol, for example a serial communication protocol, such as a single-wire communication protocol, adapted in accordance with the adaptive power control. Illustratively, the communication protocol may include a set of rules governing the communication of data and power via (in other words, over) the single-wire interface 202, and may be adapted to include an active control of the power available at the single-wire interface 202.

The controller 200 may be configured (e.g., as part of the communication protocol) to control (e.g., to instruct) a transmission 204 over the single-wire interface 202 of an instruction representative of an operation, e.g. an operation to be executed by a second (slave) device connected to the single-wire interface 202. Illustratively, the instruction may include a request for the second device to carry out that operation. According to various aspects, the instruction may be representative of (e.g., may be corresponding to) a high-current operation.

A high-current operation as used herein may be understood as an operation to be carried out, e.g. in a single-wire system (e.g., by a slave device), for which a high current consumption is expected. Illustratively, the operations carried out in a single-wire system (e.g., by a slave device) may include, among other things, low-current operations and high-current operations. A low-current operation may be associated with a low or relatively lower current consumption, and a high-current operation may be associated with a high or relatively higher current consumption. A (slave) device carrying out a low-current operation may require a relatively lower current to execute the low-current operation (may draw a relatively low power from the single-wire interface), and a device carrying out a high-current operation may require a relatively higher current (may draw a relatively high power from the single-wire interface) to execute the high-current operation. A high-current operation (illustratively, its execution) may be associated with an expected current consumption above a predefined threshold, e.g. an expected current consumption in a high-current range. As a numerical example, the predefined threshold may be in the range from 500 µA (microampere) to 5 mA (milliampere), e.g. may be 1 mA. As another numerical example, the high-current range may be from 500 µA to 5 mA, e.g. from 1 mA to 3 mA. A low-current operation (illustratively, its execution) may be associated with an expected current consumption less than a predefined threshold, e.g. an expected current consumption in a low-current range. As a numerical example, the predefined threshold for a low-current operation may be in the range from 10 µA to 300 µA, e.g. may be 100 µA. As another numerical example, the low-current range may be from 10 µA to 300 µA, e.g. from 50 µA to 150 µA.

It is understood that the aspects described herein in relation to a low-current operation or high-current operation may apply in a corresponding manner in the case that another electrical quantity was considered, e.g. a power (as described above). Illustratively, a low-current operation may be an operation associated with a low resource consumption, and may be understood as a "low-power operation" (considering a fixed voltage). A high-current operation may be an operation associated with a high resource consumption, and may be understood as a "high-power operation" (considering a fixed voltage).

As an example, a high-current operation may include a non-volatile memory write/read operation, e.g. the second (slave) device may be instructed to perform a write operation in a non-volatile memory and/or a read operation in the non-volatile memory (to write and/or read date in/from the non-volatile memory). As another example, a high-current operation may include an authentication operation, e.g. the second device may be instructed to verify or confirm the authenticity of a product (e.g., of a code, or a serial number, of the product). It is understood that a non-volatile memory write/read operation and an authentication operation are only examples, and a high-current operation may include any type of operation that may be executable in a single-wire system (by a slave device), which may be associated with a high current consumption.

The transmission 204 of the instruction over the single-wire interface 202 will be described in further detail below (see for example FIG. 3B). In brief, the transmission 204 of the instruction over the single-wire interface 202 (or more in general the transmission of data over the single-wire interface 202) may include a modulation of a signal level at the single-wire interface 202. The controller 200 may be configured to control the transmission 204 of the instruction over the single-wire interface 202 by controlling the signal level at the single-wire interface 202 (e.g., a voltage level, or a current level). It is however understood that the modulation of the signal level at the single-wire interface 202 is only an example of a strategy for data transmission over the single-wire interface 202 and other strategies may be implemented, e.g. by modulating other properties of the signal at the single-wire interface 202.

A first signal level (e.g., a first voltage level or a first current level) at the single-wire interface 202 may correspond to a first logic value (e.g., a logic "1"), and a second signal level (e.g., a second voltage level or a second current level) at the single-wire interface 202 may correspond to a second logic value (e.g., a logic "0"), as described above. The controller 200 may be configured to control a modulation of the signal level at the single-wire interface 202 to encode the instruction in an electrical signal provided at the single-wire interface 202 (e.g., the instruction may be encoded as a sequence of logic values).

According to various aspects, the controller 200 may be configured (as part of the communication protocol) to control 206 an electrical behavior of a charging path to provide current at the single-wire interface 202 as a function of the instructed high-current operation, illustratively to provide current at the single-wire interface 202 during a time period corresponding to an execution of the instructed high-current operation. Illustratively, the controller 200 may be configured to allow or enable (more) power to be made available at the single-wire interface 202 during the execution of the instructed high-current operation (by the instructed second device).

Figure 3A:
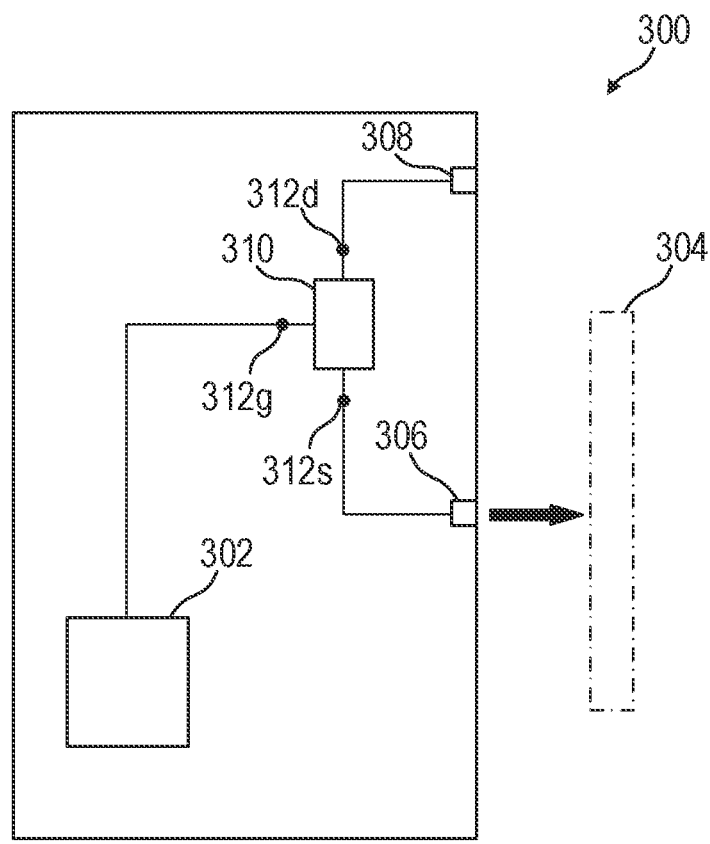
FIG. 3A and FIG. 3B each shows schematically a device, according to various aspects.
Figure 3B:
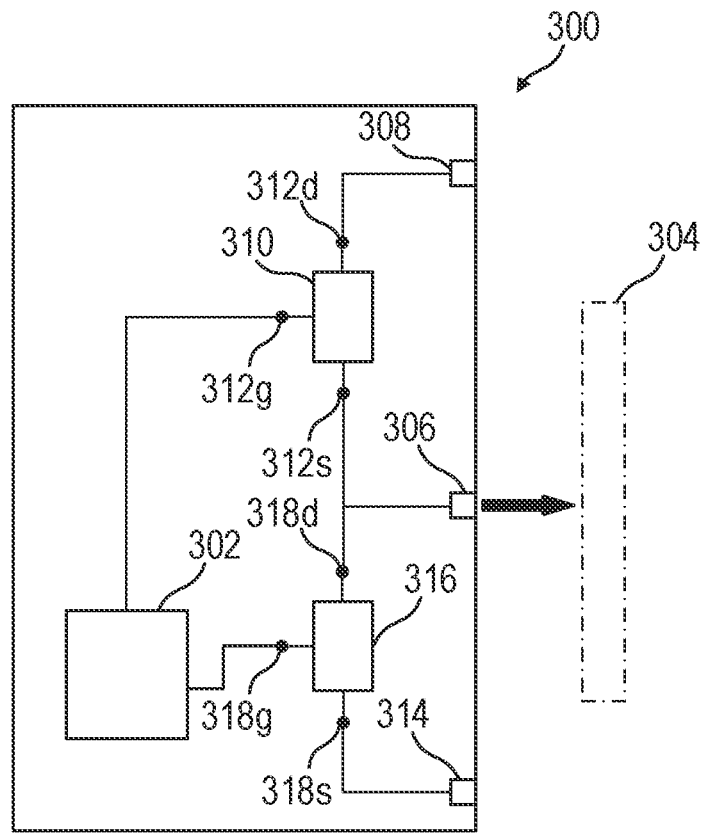
Figure 5A:
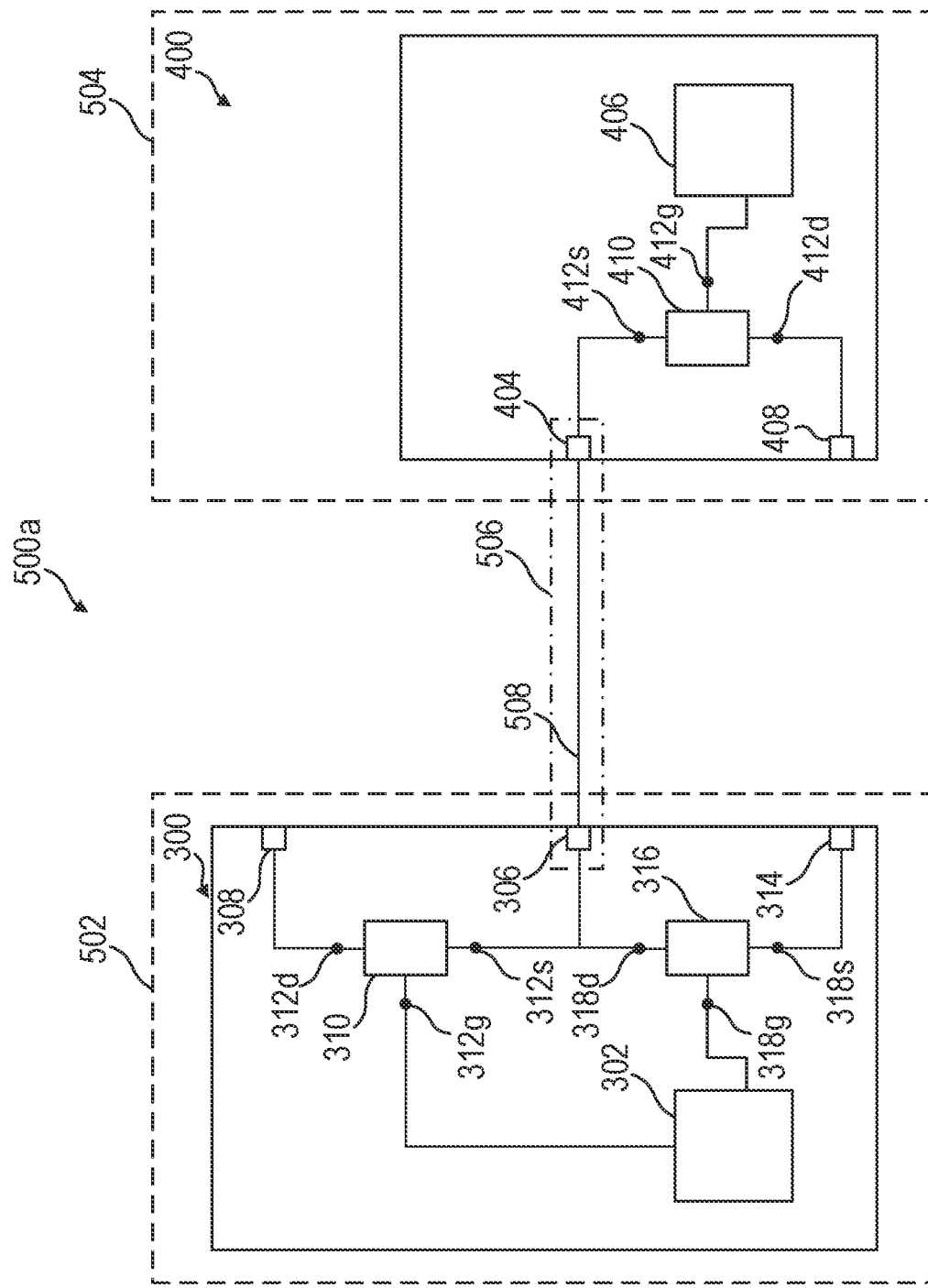
FIG. 5A, FIG. 5B, and FIG. 5C each shows schematically a system including a first device and a second device, according to various aspects.
Figure 5B:
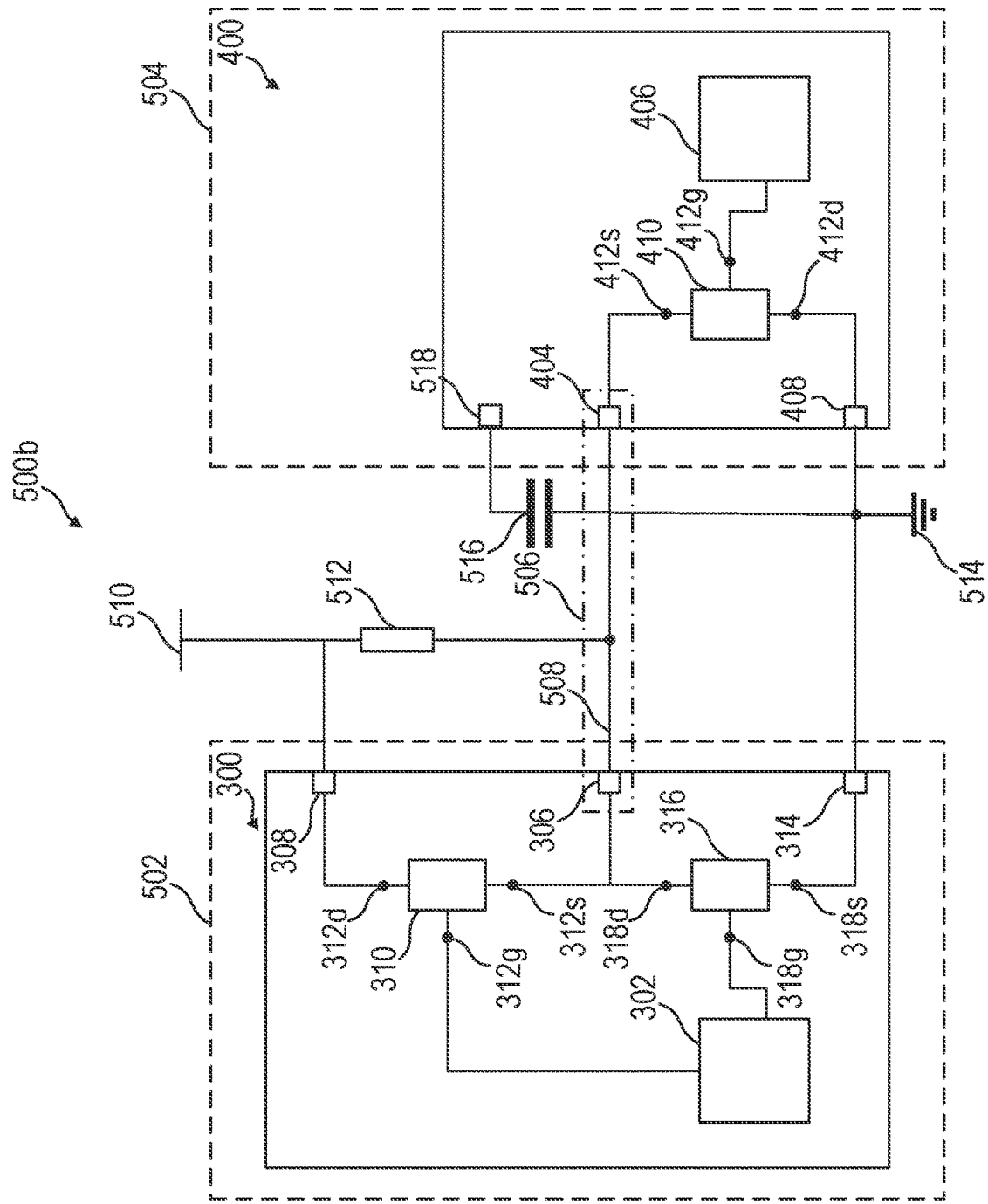
Figure 5C:
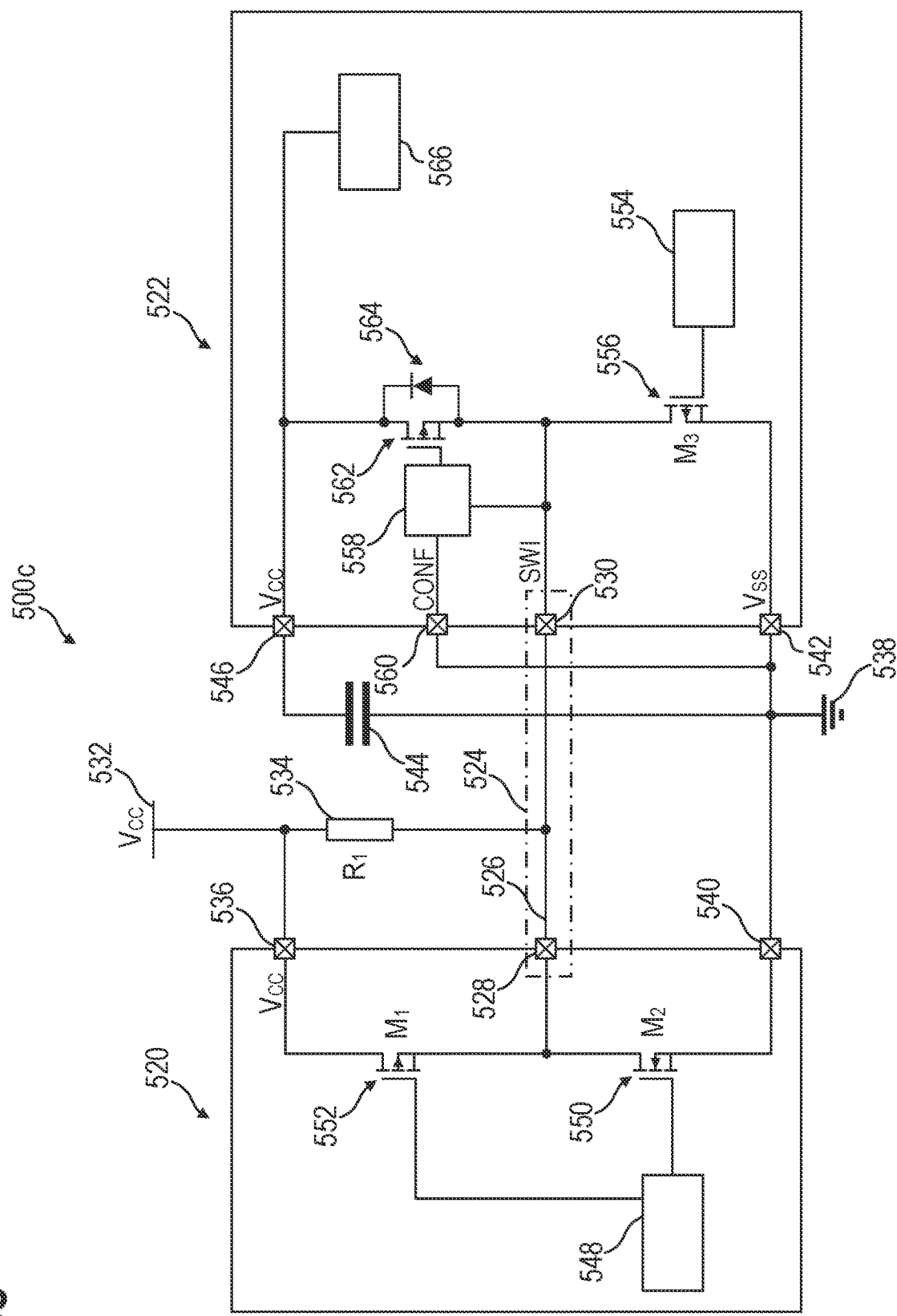

A charging path may be understood as an electrically conductive path via which current may be provided at the single-wire interface 202, e.g. an electrically conductive path between a supply (e.g., a voltage supply) and the single-wire interface 202 (see also FIG. 3B, and FIG. 5B to FIG. 5C). The control 206 of the electrical behavior of the charging path may include controlling a connection between the single-wire interface 202 and the supply. Illustratively, the controller 200 may be configured to control the electrical behavior of the charging path by controlling a connection between the single-wire interface 202 and a supply (e.g., a voltage supply) during the time period corresponding to the execution of the instructed high-current operation (e.g., by closing the connection during such time period, to allow a current flow to the single-wire interface 202).

A time period corresponding to an execution of the instructed high-current operation may be understood as a time period that the second device is expected to take to carry out (e.g., to complete) the instructed high-current operation. The time period may be fixed (e.g., a priori, based on a predefined knowledge of the high-current operation) or may be adaptively defined, e.g. the controller 200 may be configured to receive (e.g., from the second device) a signal representative of an expected time period it will take to carry out the instructed high-current operation (e.g., taking into account a state of the second device, for example the execution of other operations, and the like). In some aspects, the time period may further include an additional time period (e.g., corresponding to 5% or 10% of the time period, as examples) before and/or after the expected time period, to ensure that sufficient power may be available at the single-wire interface 202 from the beginning to the end of the high-current operation. Only as a numerical example, the time period corresponding to the execution of the instructed high-current operation may be in the range from 30 ms (milliseconds) to 200 ms, for example in the range from 50 ms to 100 ms. It is however understood that the time period may vary depending on the type of instructed operation.

According to various aspects, the controller 200 may have a (e.g., predefined) knowledge of a current consumption associated with an operation (instructed or to be instructed) and/or may have a knowledge of a time period associated with the execution of the operation. The controller 200 may include a memory storing such information or may be communicatively coupled with a memory storing such information. As an example, the memory may store a look-up table (or a plurality of look-up tables) associating an operation with a corresponding current consumption and/or a corresponding execution time. The controller 200 may implement the adaptive power control as a function of such information, e.g. may determine that the instructed operation requires a greater or relatively greater current in accordance with the stored information and/or may determine the time period during which current may be provided at the single-wire interface 202 in accordance with the stored information.

In various aspects, providing current at the single-wire interface 202 may include re-building a charge of a charging capacitor coupled with the single-wire interface 202 (e.g., with a single-wire connection), see also FIG. 5B and FIG. 5C. The single-wire interface 202 may be configured such that upon current being provided at the single-wire interface 202 (e.g., upon a signal level at the single-wire interface 202 being in a high state) the charge of the charging capacitor is re-built (illustratively, at least a portion of the current is provided at the charging capacitor). In various aspects, a system may include the controller 200 and a charging capacitor connected to the single-wire interface 202, and the charging capacitor may be configured such that a level of charge of the capacitor increases upon current being provided at the single-wire interface 202.

FIG. 3A and FIG. 3B each shows a device 300 in a schematic view according to various aspects. The device 300 may be for use in a single-wire system, e.g. the device 300 may be a host device (a master device) for use in a single-wire system. The device 300 may include a controller 302. The controller 302 may be configured as the controller 200 described in relation to FIG. 2, e.g. may be configured to implement the adaptive power control at a single-wire interface 304 (e.g., configured as the single-wire interface 202 described in relation to FIG. 2), as described herein. It is understood that the configuration of the device 300 shown in FIG. 3A and FIG. 3B is exemplary to illustrate the principles of the adaptive power control, and the device 300 may include additional or alternative components with respect to those shown (e.g., one or more diodes, one or more other processors, one or more capacitors, etc.). In some aspects, the device 300 may include a substrate, illustratively the device 300 may be disposed on the substrate (e.g., mounted on or integrated in the substrate), such as a board (e.g. a printed circuit board).

The device 300 may be configured to be connected to a single-wire interface 304. The single-wire interface 304 provide an interface between the (first) device 300 and one or more other (second, e.g. slave) devices that may be connected thereto (see for example FIG. 5A to FIG. 5C). The device 300 may be configured to exchange data (with the one or more second devices) via the single-wire interface 304. The device 300 may include a first terminal 306 configured to be connected to the single-wire interface 304, e.g. configured to be connected to a single-wire connection forming part of the single-wire interface 304 (to which one or more second devices may be connected). In some aspects, the first terminal 306 may be understood as part of the single-wire interface 304. The first terminal 306 may be a general input/output terminal (also referred to herein as single-wire terminal), via which the device 300 may interact with the single-wire interface 304.

The device 300 may further include a second terminal 308 configured to be connected to a supply (also referred to herein as supply source), e.g. to a voltage supply (see FIG. 5B and FIG. 5C). The second terminal 308 may be also referred to herein as supply terminal (e.g., as voltage supply terminal). Illustratively, the second terminal may be configured to be connected to a supply source that provides power (e.g., a voltage) for the operation of the device 300 (and for the operation of the one or more second devices connected to the single-wire interface 304, as described in further detail below).

The second terminal 308 and the first terminal 306 may be connected with one another over a (first) switchable element 310. Illustratively, the device 300 may include an electrically conductive path (a charging path) between the first terminal 306 and the second terminal 308, which may be connected or disconnected by controlling the first switchable element 310. Further illustratively, the charging path to provide current at the single-wire interface 304 may include a charging path between the supply terminal 308 and the single-wire interface 304 (the respective terminal 306). The first switchable element 310 may be coupled between the single-wire interface 304 (the respective terminal 306) and the supply terminal 308.

As an exemplary configuration, the first switchable element 310 may be or may include a first field-effect transistor 310, such as a metal-oxide-semiconductor field-effect transistor (MOSFET), e.g. one of a NMOS field-effect transistor or a PMOS field-effect transistor. In some aspects, the first field-effect transistor 310 may include a plurality of field-effect transistors (e.g., a plurality of MOSFETs) connected in parallel with one another, illustratively, the function of controlling the electrically conductive path between the supply terminal 308 and the single-wire interface 304 may be carried out with one field-effect transistor 310 or with a plurality of field-effect transistors 310 controlled in parallel with one another.

In the following, a description of the operation of a switchable element (e.g., the first switchable element 310, and below a second switchable element and a third switchable element) in the context of the adaptive power control is provided considering a (e.g., first, second, third) field-effect transistor. A field-effect transistor may provide a rapid switching time, and may provide ready integration in a semiconductor substrate (e.g., in a printed circuit board). It is however understood that the aspects described herein may apply in a similar manner to a different configuration of a switchable element (e.g., in the case that the switchable element includes another type of element configured to provide the desired switching function).

The first field-effect transistor 310 may include one or more control nodes (also referred to herein as control terminals), e.g. the first field-effect transistor 310 may include at least a second control node 312s, a third control node 312d, and a first control node 312g to control an electrical behavior of the second control node 312s and the third control node 312d of the first field-effect transistor 310 (e.g., a current flow between the second control node 312s and the third control node 312d).

Considering a field-effect transistor structure, the first field-effect transistor 310 may include two source/drain regions and a gate region (also referred to as gate structure) to control a current flow between the two source/drain region. The first field-effect transistor 310 may include a gate node 312g, a source node 312s, and a drain node 312d. The gate node 312g may be coupled to the gate region of the first field-effect transistor 310, the source node 312s may be coupled to the source region of the first field-effect transistor 310, and the drain node 312d may be coupled to the drain region of the first field-effect transistor 310. Depending on the configuration of the first field-effect transistor 310 (e.g., NMOS or PMOS), the second node 312s may include one of a source node or a drain node, and the third node 312d may include the other one of the source node or the drain node.

The first node 312g and the controller 302 may be coupled with one another. One of the second node 312s or the third node 312d (the second node in the configuration in FIG. 3A and FIG. 3B) may be coupled to the single-wire interface 304 (e.g., to the single-wire terminal 306) and the other one of the second node 312s or the third node 312d may be coupled to the supply terminal 308.

The controller 302 may be configured to control the electrical behavior of the charging path to provide current at the single-wire interface 304 (illustratively, the charging path between the first terminal 306 and the second terminal 308) by providing a control signal at the first node 312g of the first field-effect transistor 310 to control an electrical behavior of the second node 312s and the third node 312d of the first field-effect transistor 310.

A control signal at the gate terminal 312g of the first field-effect transistor 310 may include, for example, a voltage provided at the gate node 312g to provide a gate-source voltage drop at the first field-effect transistor 310 (e.g., a control signal may include a first voltage at the first node 312g and a second voltage, such as a reference voltage (e.g., 0 V), at the source node 312s). The polarity of the gate-source voltage drop (illustratively, the respective voltages at the gate node 312g and the source node 312s) may be selected in accordance with the configuration of the first field-effect transistor 310 (e.g., NMOS or PMOS).

The first field-effect transistor 310 may be configured, in a first state (e.g., a ON state), to allow a current flow between the second node 312s and the third node 312d (a source-drain current) to reduce a resistance of the charging path between the supply terminal 308 and the single-wire interface 304. Illustratively, in the first state, the first field-effect transistor 310 may be configured to electrically connect the supply terminal 308 and the single-wire interface 304 with one another (by allowing a current flow in a channel region between the source region and the drain region of the first field-effect transistor 310). Reducing the resistance may correspond to an increase in the conductivity of the channel region, thus providing the connection between the supply terminal 308 and the single-wire interface 304 (e.g., between the supply terminal 308 and the single-wire terminal 306).

The first field-effect transistor 310 may be configured, in a second state (e.g., a OFF state), to prevent the current flow between the second node 312s and the third node 312d, e.g. to increase a resistance of the charging path between the supply terminal 308 and the single-wire interface 304. Illustratively, in the second state, the first field-effect transistor 310 may be configured to electrically disconnect the supply terminal 308 and the single-wire interface 304 from one another (by preventing the current flow in the channel region between the source region and the drain region of the first field-effect transistor 310).

The control signal provided at the first field-effect transistor 310 may be configured to bring the first field-effect transistor 310 in the first state or the second state as a function of the expected current consumption at the single-wire interface 304 (e.g., as a function of the instructed high-current operation). The control signal may include a first control signal to bring the first field-effect transistor 310 in the first state during the time period corresponding to the execution of the instructed high-current operation. A (first) gate-source voltage drop configured to allow a current flow in the channel region of the first field-effect transistor 310 may be provided during the execution of the instructed high-current operation to establish an electrically conductive connection between the single-wire interface 304 and the supply terminal 308.

In various aspects, the control signal may include a second control signal to bring the field-effect transistor 310 in the second state after the time period corresponding to the execution of the instructed high-current operation. Illustratively, the controller 302 may be configured to control the electrical behavior of the charging path to disconnect the single-wire interface 304 the second terminal 308 after the instructed high-current operation has been executed. A (second) gate-source voltage drop configured to prevent the current flow in the channel region of the first field-effect transistor 310 may be provided after the execution of the instructed high-current operation to open the electrically conductive connection between the single-wire interface 304 and the supply terminal 308.

The transmission of data from the device 300 (e.g., the transmission of the instruction corresponding to the high-current operation) over the single-wire interface 304 will be described in further detail in relation to FIG. 3B.

In various aspects, as shown in FIG. 3B, the device 300 may be configured to be connected to a reference supply (e.g., to a reference voltage source, e.g. to ground). The device 300 may include a third terminal 314 configured to be connected to the reference supply. The third terminal 314 may be also referred to herein as reference terminal 314 or reference voltage terminal 314. Illustratively, the third terminal 314 be configured to provide a return path for a current flowing between the device 300 and the one or more second devices coupled to the single-wire interface 304.

The third terminal 314 and the first terminal 306 may be connected with one another over a second switchable element 316. Illustratively, the device 300 may include an electrically conductive path between the first terminal 306 and the third terminal 314, which may be connected or disconnected by controlling the second switchable element 316. The second switchable element 316 may be coupled between the single-wire interface 304 (the respective terminal 306) and the reference terminal 314.

As an exemplary configuration, the second switchable element 316 may be or may include a field-effect transistor, such as a metal-oxide-semiconductor field-effect transistor (MOSFET), e.g. one of a NMOS field-effect transistor or a PMOS field-effect transistor. According to various aspects, the first field-effect transistor 310 and the second field-effect transistor 316 may have opposite polarity, e.g. the first field-effect transistor 310 may be a PMOS and the second field-effect transistor 316 may be an NMOS, or vice versa. In some aspects, the second field-effect transistor 316 may include a plurality of field-effect transistors (e.g., a plurality of MOSFETs) connected in parallel with one another.

The second field-effect transistor 316 may have a similar structure as the first field-effect transistor 310, and may include one or more control nodes, e.g. at least a second control node 318s (one of a source node or a drain node), a third control node 318d (the other one of the source node or the drain node), and a first control node 318g (a gate node) to control an electrical behavior of the second control node 318s and the third control node 318d of the second field-effect transistor 316 (e.g., a current flow between the second control node 318s and the third control node 318d). The first node 318g and the controller 302 may be coupled with one another. One of the second node 318s or the third node 318d (the third node in the configuration in FIG. 3B) may be coupled to the single-wire interface 304 (e.g., to the single-wire terminal 306) and the other one of the second node 318s or the third node 318d may be coupled to the reference terminal 314.

As described in relation to FIG. 2, the transmission of data (e.g., of the instruction) over the single-wire interface 304 may include controlling the signal level at the single-wire interface 304. The controller 302 may be configured to control the signal level at the single-wire interface 304 by providing a control signal (also referred to herein as data control signal, e.g. a voltage) at the first node 318g of the second field-effect transistor 316 to control the electrical behavior of the second node 318s and the third node 318d of the second field-effect transistor 316. Illustratively, the transmission of data may include connecting or disconnecting the single-wire interface 304 to/from the reference terminal 314 (to ground, for example), e.g. to pull-down (in case of connection) or up (in case of disconnection) the signal level at the single-wire interface 304 (see also FIG. 5B and FIG. 5C).

The second field-effect transistor 316 may be configured, in a first state (e.g., a ON state), to allow a current flow between the second node 318s and the third node 318d to reduce a resistance of the path between the reference terminal 314 and the single-wire interface 304, illustratively, in the first state, the second field-effect transistor 316 may be configured to electrically connect the reference terminal 314 and the single-wire interface 304 with one another, thus pulling-down the signal level at the single-wire interface 304 (corresponding, for example, to a logic "0").

The second field-effect transistor 316 may be configured, in a second state (e.g., a OFF state), to prevent the current flow between the second node 318s and the third node 318d to increase a resistance of the path between the reference terminal 314 and the single-wire interface 304. Illustratively, in the second state, the field-effect transistor 316 may be configured to electrically disconnect the reference terminal 314 and the single-wire interface 304 from one another, thus pulling-up the signal level at the single-wire interface 304 (corresponding, for example, to a logic "1", see also FIG. 5B and FIG. 5C).

The data control signal may be configured as a function of the data (e.g., the instruction) transmitted (or to be transmitted) over the single-wire interface 304, e.g. may include one or more first (data) control signals to bring the second field-effect transistor in the first state (to transmit one or more "0s") and/or one or more second (data) control signals to bring the second field-effect transistor in the second state (to transmit one or more "1s"). Illustratively, the data control signal may include a sequence of (first or second) control signals as a function of a sequence of logic values to be transmitted (as a function of logic values to be encoded in a signal provided over the single-wire interface 304).

Figure 4:
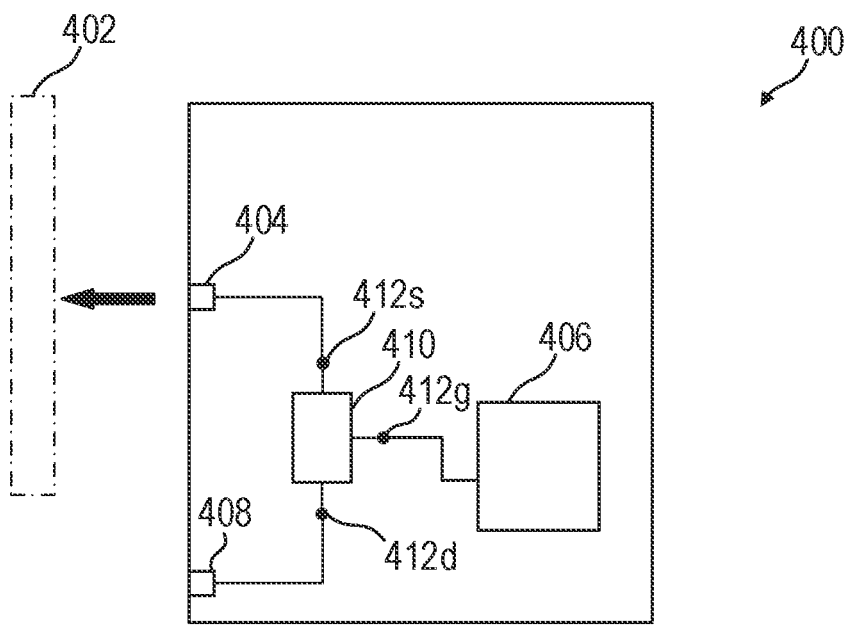
FIG. 4 shows schematically a single-wire device, according to various aspects.

FIG. 4 shows a single-wire device 400 in a schematic view according to various aspects. The single-wire device 400 may be for use in a single-wire system, e.g. the single-wire device 400 may be a slave device for use in a single-wire system. It is understood that the configuration of the single-wire device 400 shown in FIG. 4 is exemplary to illustrate the principles of the adaptive power control, and the device 400 may include additional or alternative components with respect to those shown (e.g., one or more diodes, one or more other processors, one or more capacitors, etc.). In some aspects, the single-wire device 400 may include a substrate, illustratively the single-wire device 400 may be disposed on the substrate (e.g., mounted on or integrated in the substrate), such as a board (e.g. a printed circuit board).

The single-wire device 400 may be configured to be connected to a single-wire interface 402 (e.g., configured as the single-wire interface 202, 304 described in relation to FIG. 2 to FIG. 3B). The single-wire interface 402 may provide an interface between the (second) single-wire device 400 and another (first, e.g. host) device that may be connected thereto (e.g., the device 300, see for example FIG. 5A to FIG. 5C). The single-wire device 400 may be configured to exchange data (with the first device) via the single-wire interface 402. The single-wire device 400 may include a first terminal 404 (herein also referred to as fourth terminal) configured to be connected to the single-wire interface 402, e.g. configured to be connected to a single-wire connection forming part of the single-wire interface 404 (to which the first device and optionally one or more other single-wire devices may be connected). In some aspects, the first terminal 404 may be understood as part of the single-wire interface 402. The first terminal 404 may also be referred to herein as single-wire terminal, e.g. a terminal via which the single-wire device 400 may interact with the single-wire interface 402.

The single-wire device 400 may be configured to receive data and draw power via/from the single-wire interface 402, e.g. may be configured to receive a signal at the first terminal 404 configured to carry data and power to the single-wire device 400. The single-wire device 400 may be configured to receive an instruction via the single-wire interface 402 (e.g., from a host device) to instruct an operation to be carried out by the single-wire device 400. Illustratively, the single-wire device 400 may be configured to carry out an operation in response to an instruction corresponding to that operation received via the single-wire interface 402. In various aspects, the single-wire device 400 may be configured to carry out a high-current operation (e.g., instructed by a host device, e.g. by the controller of the host device) in response to receiving the instruction corresponding to the high-current operation over the single-wire interface 402.

The single-wire device 400 may be further configured to carry out other types of operations, e.g. following the execution of a previous operation or upon receiving a corresponding instruction via the single-wire interface 402. As an example, the single-wire device 400 may be configured to run a low-current operation (e.g., the sensing of a physical quantity, such as a temperature) after execution of the high-current operation. As another example, the single-wire device 400 may be configured to enter into an interrupt mode after execution of the high-current operation.

The single-wire device 400 may include a controller 406 (also referred to herein as second controller) configured to control an operation of the single-wire device 400. The second controller 406 may be configured to control the execution of an operation in response to an instruction received via the single-wire interface 402 (e.g., may be configured to decode the instruction encoded in a received signal, and to take a corresponding action). In various aspects, the second controller 406 may be configured to control (e.g., to instruct) a transmission of data from the single-wire device 400, e.g. may be configured to control a transmission of data over the single-wire interface 402 (e.g., to a first, host, device).

The transmission of data may be carried out in a similar manner as described in relation to the device 300 in FIG. 3B. In brief, the second controller 406 may be configured to control the transmission of data over the single-wire interface 402 by controlling a signal level at the single-wire interface 402 (e.g., a first signal level may correspond to a first logic value and a second signal level may correspond to a second logic value, for example a high signal level may be a logic "1" and a low signal level may be a logic "0", as described above).

The single-wire device 400 may be configured to be connected to a reference supply (e.g., to a reference voltage source, e.g. to ground). The single-wire device 400 may include a second terminal 408 (also referred to herein as fifth terminal) configured to be connected to the reference supply. The second terminal 408 may be also referred to herein as reference terminal 408 or reference voltage terminal 408. The second terminal 408 and the first terminal 404 may be connected with one another over a (third) switchable element 410. The electrically conductive path between the first terminal 404 and the second terminal 408 may be connected or disconnected by controlling the (third) switchable element 410. The (third) switchable element 410 may be coupled between the single-wire interface 402 (the respective terminal 404) and the reference terminal 408. As an exemplary configuration, the (third) switchable element 410 may be or may include a field-effect transistor, such as a metal-oxide-semiconductor field-effect transistor (MOSFET), e.g. one of a NMOS field-effect transistor or a PMOS field-effect transistor.

The (third) field-effect transistor 410 may have a similar structure as the first and second field-effect transistors 310, 316 described in relation to FIG. 3A and FIG. 3B, and may include one or more control nodes, e.g. at least a second control node 412s (one of a source node or a drain node), a third control node 412d (the other one of the source node or the drain node), and a first control node 412g (a gate node) to control an electrical behavior of the second control node 412s and the third control node 412d. The first node 412g and the controller 406 may be coupled with one another. One of the second node 412s or the third node 412d (the second node in the configuration in FIG. 4) may be coupled to the single-wire interface 402 (e.g., to the single-wire terminal 404) and the other one of the second node 412s or the third node 412d may be coupled to the reference terminal 408.

The controller 406 may be configured to control the signal level at the single-wire interface 402 by providing a control signal (also referred to herein as slave data control signal, e.g. a voltage) at the first node 412g of the field-effect transistor 410 to control the electrical behavior of the second node 412s and the third node 412d, e.g. to pull-down (in case of connection) or up (in case of disconnection) the signal level at the single-wire interface 402 (see also FIG. 5B and FIG. 5C), as described above in relation to the second field-effect transistor 316 in FIG. 3B.

The field-effect transistor 410 may be configured, in a first state (e.g., a ON state), to allow a current flow between the second node 412s and the third node 412d to reduce a resistance of the path between the reference terminal 408 and the single-wire interface 402, thus pulling-down the signal level at the single-wire interface 402 (corresponding, for example, to a logic "0"). The field-effect transistor 410 may be configured, in a second state (e.g., an OFF state), to prevent the current flow between the second node 412s and the third node 412d to increase a resistance of the path between the reference terminal 408 and the single-wire interface 402, thus pulling-up the signal level at the single-wire interface 402 (corresponding, for example, to a logic "1", see also FIG. 5B and FIG. 5C).

The slave data control signal may be configured as a function of the data transmitted (or to be transmitted) over the single-wire interface 402, e.g. may include one or more first control signals to bring the field-effect transistor 410 in the first state (to transmit one or more "0s") and/or one or more second (data) control signals to bring the second field-effect transistor in the second state (to transmit one or more "1s"), as a function of a sequence of logic values to be transmitted.

FIG. 5A and FIG. 5B each shows a system 500a, 500b in a schematic configuration according to various aspects. The system 500a, 500b may include a first device 502 and a second device 504 connected to one another over a (e.g., bidirectional) single-wire interface 506 (e.g., configured as the single-wire interface 202, 304, 402 described in relation to FIG. 2 to FIG. 4). The first device 502 may be configured as the device 300 described in relation to FIG. 3A and FIG. 3B. The second device 504 may be configured as the single-wire device 400 described in relation to FIG. 4. Illustratively, the first device 502 may be configured as a host device (as a master device), and the second device 504 may be configured as a slave device. The system 500a, 500b may be a single-wire system. It is understood that the system 500a, 500b may include more than one second device 504, e.g. a plurality of second devices 504 connected to the first device 502 via the single-wire interface.

The single-wire interface 506 may provide bidirectional communication between the first device 502 and the second device 504. The single-wire interface 506 may include a single-wire connection 508 via which the first device 502 and the second device 504 are connected to one another (e.g., at the respective first terminal 306, 404, which may be understood as forming part of the single-wire interface 506). In some aspects, the single-wire interface 506 may be understood to include respective conductive traces of the first device 502 and the second device 504.

As discussed in relation to FIG. 3A, the controller of the first device 502 may be configured to control a transmission over the single-wire interface 506 of an instruction (to the second device 504) representative of a high-current operation, and may be configured to control (e.g., via controlling the first field-effect transistor 310 of the first device 502) an electrical behavior of a charging path to provide current at the single-wire interface 506 as a function of the instructed high-current operation.

Additional components that may be included in the system 500a, 500b and/or in the first device 502/second device 504, as well as a communication between the first device 502 and second device 504 will be described in further detail in relation to FIG. 5B. It is understood that the configuration described in relation to FIG. 5B is an example, to illustrate additional optional components of the system 500b, and that the system 500b may include further additional, alternative, or less components with respect to those shown.

The system 500b may include a supply 510 (a supply source) configured to power the system 500b (e.g., to power the first device 502). The supply 510 may be, for example, a voltage supply configured to provide a supply voltage at the first device 502 (and at the single-wire interface 506). The supply 510 and the supply terminal (the first terminal 308) of the first device 502 may be coupled with one another. As a numerical example, considering a voltage supply, the supply 510 may be configured to supply a voltage in the range from 0.8 V to 2 V, for example in the range from 1 V to 1.5 V.

The controller of the first device 502 may be configured to provide a control signal at the first field-effect transistor of the first device 502 to bring it into the first state to electrically connect the supply 510 and the single-wire interface 506, illustratively to provide a voltage drop that allows a current flow towards the single-wire interface 506 (and towards the second device 504) during the execution of the instructed high-current operation by the second device 504.

In various aspects, the system 500b may include a pull-up resistor 512 coupled between the single-wire interface 506 (e.g., the single-wire connection 508) and the (voltage) supply 510. The pull-up resistor 512 may be configured to provide a (further) charging path to provide current at the single-wire interface 506. Illustratively, the pull-up resistor 512 may provide an electrically conductive path connecting the single-wire interface 506 and the supply 510 with one another. A voltage drop over the pull-up resistor 512 may provide a corresponding current flowing towards the single-wire interface 506. Only as a numerical example, the pull-up resistor 512 may have a resistance in the range from 400Ω (Ohm) to 1000Ω, for example in the range from 500Ω to 750Ω. The pull-up resistor 512 may provide the open drain pull up operation for communication and power for the bus power application.

The first field-effect transistor 310 of the first device 502 may provide an alternate resistance path between the supply 510 and the single-wire interface 506, so that turning on the first field-effect transistor may reduce the overall resistance between the supply 510 and the single-wire interface 506, as described in relation to FIG. 3A. This may reduce the voltage drop across the supply 510 and the single-wire interface 506, thus providing a higher voltage margin for the bus power application, e.g. in the case that the second device 504 is drawing high current.

The adaptive power control as described herein may thus provide an improvement of the overall system margin of a bus powered application compared to having only the open drain pull-up resistor 512. The speed of the charging path during power up may also be increased. The first device 502 (the host) may adaptively improve the charging path in the case that the current demand of the second device 504 (the chip) increases.

In various aspects, the system 500b may include a reference supply 514 configured to supply a reference signal at the first device 502 and the second device 504. As an example, the reference supply 514 may be or may include a reference voltage source configured to provide a reference voltage at the first device 502 and the second device 504 (e.g., a ground voltage), e.g. the reference supply 514 may include a connection to ground. The reference supply 514 and the reference terminal (the third terminal 314) of the first device 502 may be coupled with one another, and the reference supply 514 and the reference terminal (the second terminal 408) of the second device 502 may be coupled with one another.

The transmission of data over the single-wire interface 506 may be carried out as described in relation to FIG. 3B (from the first device 502 to the second device 504) and in relation to FIG. 4 (from the second device 504 to the first device 502). The transmission of data may include pulling the signal at the single-wire interface 506 low (e.g., to ground) to transmit a logic "0" and by releasing the signal high (e.g., at the supply voltage) to transmit a logic "1".

From the point of view of the first device 502, pulling the signal low may include turning on the second field-effect transistor (e.g., the field-effect transistor 316), while the first field-effect transistor and the field-effect transistor of the second device 504 are turned off, whereas releasing the signal high may include turning off the second field-effect transistor, while the first field-effect transistor and the field-effect transistor of the second device 504 are turned off (so that the signal at the single-wire interface 506 is at the level defined by the supply 510 over the pull-up resistor 512).

From the point of view of the second device 502, pulling the signal low may include turning on the (third) field-effect transistor (e.g., the field-effect transistor 410), while the first and second field-effect transistors of the first device 502 are turned off, whereas releasing the signal high may include turning off the (third) field-effect transistor, while the first and second field-effect transistors of the first device 502 are turned off (so that the signal at the single-wire interface 506 is at the level defined by the supply 510 over the pull-up resistor 512).

Illustratively, during the transmission of data from the second device 504 to the first device 502 over the single-wire interface 506, the controller of the first device 502 may be configured to bring the first field-effect transistor and the second field-effect transistor of the first device 502 in the respective second (off) state. During the transmission of data from the first device 502 to the second device 502 over the single-wire interface 506, the controller of the second device 504 may be configured to bring the (third) field-effect transistor of the second device 504 in the respective second (off) state. In a typical open drain operation, the first field-effect transistor of the first device 502 is not used in the open drain communication. During communication from the first device 502 to the second device 504 or from the second device 504 to the first device 502, the first field-effect transistor is in off mode, and the pull-up resistor 512 is used to drive the single-wire interface 506 (e.g., the single-wire connection 508) high to indicate a logic 1 state. When the first device 502 or the second device 504 want to send a logic 0, the respective field-effect transistors (e.g., the second field-effect transistor 316, or the third field-effect transistor 410) may be turned on to drive the single-wire interface bus low.

The transmission of data (e.g., of the instruction) from the second device 504 to the first device 502 may thus be carried out during first device 502 being in a tristate phase (with the first field-effect transistor 310 and the second field-effect transistor 316 being off).

In various aspects, the system 500b may include a charging capacitor 516 configured to configured to provide energy to the second device 504 during an operation of the second device 504 (e.g., during communication from the second device 504 to the first device 502, or during an execution of an operation by the second device 504). The charging capacitor 516 may be configured to store charge for powering the second device 504 when power supply from the first device 502 is not available (e.g. when the single-wire interface 506 is being used for communication, or when the signal at the single-wire interface 506 is pulled low). The charging capacitor 516 may be connected to the single-wire interface 506 (e.g., to the single-wire connection 508), and may be connected to a (third) terminal 518 (a supply terminal) of the second device 504. The charging capacitor 516 may be further connected to the reference supply 514 (e.g., to ground). Only as a numerical example, the charging capacitor 516 may have a capacitance in the range from 0.1 µF (microfarad) to 5 µF, for example from 1 µF to 3 µF. Smaller capacitances may provide faster response times (illustratively, faster charging/discharging).

The charging capacitor 516 may be configured to be charged by the power available at the single-wire interface 506 (e.g., by a current flowing into the capacitor 516), illustratively, the capacitor 516 may be charged when the signal at the single-wire interface 506 is at the high level. The charging capacitor 516 may be configured in such a way that a charge of the charging capacitor 516 is re-built (illustratively, a level of charge increases) upon current being provided at the single-wire interface 506 (at the single-wire connection 508). In various aspects, the controller of the first device 502 (e.g., the controller 302) may be configured to allow current to be provided at the single-wire interface 506 (by providing a control signal at the first field-effect transistor) to re-build the charge of the charging capacitor 516. This may provide charging back the energy that may be lost during the communication phase (the energy consumed by the second device 504 to communicate with the first device 502), as discussed in further detail below in relation to FIG. 6.

FIG. 5C shows a single-wire system 500c including a first device 520 (a host device) and a second device 522 (a single-wire device) in a schematic view according to various aspects. The single-wire system 500c may be an exemplary configuration of the system 500a, 500b described in relation to FIG. 5A and FIG. 5B, e.g. the first device 520 and the second device 522 may be an exemplary configuration of the first device 502 and the second device 504 described in relation to FIG. 5A and FIG. 5B, respectively.

The host device 520 and the single-wire device 522 may be connected to one another over a single-wire interface 524, e.g. including a single-wire connection 526 and respective terminals 528, 530 of the host device 520 and of the single-wire device 522.

The single-wire system 500c may include a voltage supply 532 configured to provide a supply voltage at the single-wire interface 524, e.g. a supply voltage $V_{CC}$ in the range from 1.62 V to 1.98 V, only as an example. The voltage supply 532 may be connected to the single-wire interface 524 (e.g., to the single-wire connection 526) over a pull-up resistor 534 ($R_1$), e.g. a pull-up resistor 534 having a resistance of about 680Ω±1%, only as a numerical example. The voltage supply 532 may be further connected to the host device 520, e.g. at a voltage supply terminal 536.

The single-wire system 500c may further include a reference supply 538 configured to provide a supply voltage at the single-wire interface 524, e.g. ground voltage ($V_{SS}$, also referred to herein as source voltage). For example, the reference supply 538 may be or may include a connection to ground. The reference supply 538 may be connected to the single-wire interface 524 (e.g., to the single-wire connection 526). The reference supply 538 may be further connected to the host device 520, e.g. at a reference terminal 540, and to the single-wire device 524, e.g. at a reference terminal 542.

The single-wire system 500c may further include a charging capacitor 544 connected with the single-wire interface 524 and with the single-wire device 522 (e.g., at a supply terminal 546). The charging capacitor 544 may be configured to be charged upon the signal level at the single-wire interface 524 being high. The charging capacitor 544 may be configured to power an operation the single-wire device 522. As a numerical example, the charging capacitor 544 may have a capacitance of 2.2 µF.

The host device 520 may include a (host) controller 548 (e.g., including a transceiver) configured to control an operation of the host device 520. The controller 548 may be configured to control a transmission of data from the host device 520 to the single-wire device 522 over the single-wire interface 524 by controlling a (second) MOSFET 550, $M_2$, (e.g., a N-MOS field-effect transistor), illustratively to pull-low or release high the signal level at the single-wire interface 524, as described above. The controller 548 may be configured to control a transmission of an instruction corresponding to a high-current operation from the host device 520 to the single-wire device 522 over the single-wire interface 524, as described in relation to FIG. 2.

The controller 548 may be configured to allow a current to be provided at the single-wire interface 524 by controlling a (first) MOSFET 552, $M_1$, (e.g., a P-MOS field-effect transistor), e.g. to power the operation of the single-wire device 522 and/or to re-charge the charging capacitor 544. The controller 548 may be configured to turn on the MOSFET 552 during the execution of the high-current operation by the single-wire device 522 to provide an alternative path for the voltage supply 532, so that the single-wire device 522 may draw sufficient power from the single-wire interface 524. The voltage drop over the pull-up resistor 534 may be reduced when the MOSFET 552 is turned on, thus increasing the operating margin of the system 500c.

The single-wire device 522 may include a (slave) controller 554 (e.g., including a transceiver) configured to control an operation of the single-wire device 522. The controller 554 may be configured to control a transmission of data from the single-wire device 522 to the host device 520 over the single-wire interface 524 by controlling a (third) MOSFET 556, $M_3$, (e.g., a P-MOS field-effect transistor), illustratively to pull-low or release high the signal level at the single-wire interface 524, as described above.

The single-wire device 522 may further include a configuration controller 558 configured to control whether the single-wire device 522 operates in direct power mode or indirect power mode. The configuration controller 558 may be configured to select the operation mode as a function of a configuration signal (CONF) received at the single-wire device 522 (e.g., at a configuration terminal 560). The configuration signal may be indicative of an instruction to select one of the indirect power mode and the direct power mode. In the indirect power mode, the single-wire device 522 may be configured to draw its operating power exclusively from the charging capacitor 544, illustratively from the charge stored in the charging capacitor 544. In the direct power mode, the single-wire device 522 may be configured to derive its operating power directly from a power supply (e.g., from a current source or a voltage source). The single-wire device 522, in direct power mode, may draw power via the supply terminal 546, which may be connected (not shown) to the voltage supply 532 or to another supply source (e.g., a current source or a voltage source, for example the supply terminal 546 may be connected to a battery supply). In some aspects, the configuration controller 558 may be configured to control the charging of the charging capacitor 544 (only) in the indirect power mode. The configuration controller 558 may be configured to select the operation mode by controlling a configuration MOSFET 562 (e.g., a NMOS field-effect transistor) coupled in parallel with a diode 564 (e.g., the diode 564 may be coupled to the source node and the drain node of the MOSFET 562). CONF may be connected to $V_{SS}$ for indirect power mode or connected to $V_{CC}$ for direct power mode. In direct power mode $V_{CC}$ may be equal to or greater than the signal at the terminal 530 of the second device 522 ($V_{CC} \geq SWI$). As a numerical example, $V_{CC}$ for direct power mode may be in the range from 1.62 V to 3.63 V (able to support down to 1.24 V). As another numerical example, a voltage drop of about 30 mV may occur across the diode 564.

The single-wire device 522 may further include a low-dropout regulator (LDO) 566 configured to regulate the voltage received at the single-wire device 522 (e.g., received at the supply terminal 546).

FIG. 6 shows a time diagram 600 illustrating an exemplary operation of a system including a first (host) device and a second (slave, e.g. single-wire) device connected to one another over a single-wire interface. The time diagram 600 may illustrate an exemplary operation of the system 500a, 500b, 500c described in relation to FIG. 5A to FIG. 5C. The time diagram 600 may show how to configure a host software for programming a controller of a host device for implementing the adaptive power control described herein (illustratively, for controlling the first field-effect transistor of the host device providing control over a charging path to provide current at a single-wire interface).

The time diagram 600 may show the state over time of the field-effect transistors of the host device (e.g., the first field-effect transistor connected between the single-wire interface and the supply, represented by the line 602, and the second field-effect transistor connected between the single-wire interface and the reference, represented by the line 604), and of the field-effect transistors of the slave device (the third field-effect transistor connected between the single-wire interface and the reference, represented by the line 606). A high level of the line associated with a field-effect transistor may represent an ON state of that field-effect transistor, and a low level of the line associated with a field-effect transistor may represent an OFF state of that field-effect transistor.

At the beginning of the operation, 610 (0), the field-effect transistors may be in the OFF state as long as the operation of the first device and the second device has not yet started.

The host device may initialize the startup phase, 612 (1). The host device (e.g., its controller) may be configured to turn on the first field-effect transistor to speed up the charging path during the power up of the system. Illustratively, the first field-effect transistor may be turned on to provide an additional charging path (one through the pull-up resistor, and one through the first field-effect transistor) for providing current at the single-wire interface.

Following the startup phase, there may be a communication phase, in 614 (2), from the host device to the single-wire device. The host device (e.g., its controller) may be configured to either turn off the first field-effect transistor or to utilize it during the communication phase. In the case that the first field-effect transistor is turned off, the charging path to provide current at the single-wire interface is through the pull-up resistor. The communication may be carried out as described above, e.g. pulling low and/or releasing high the signal level at the single-wire interface by controlling the second field-effect transistor.

Following the communication phase there may be a bus idle phase, in 616 (3). The bus idle phase may be between two communication phases (from host to slave in 614, and from slave to host in 618). In the idle phase 616, the host device may turn off the first field-effect transistor so that the bus (the single-wire interface, e.g. the single-wire connection) is in open drain configuration in which the pull-up resistor is used for communication and charging path.

Following the idle phase there may be a device communication phase, in 618 (4), from the slave device to the host device. The host may turn off the first field-effect transistor and the second field-effect transistor during this communication phase, in which the pull-up resistor is used for communication and charging path. The communication at the side of the slave device may be carried out as described above, e.g. pulling low and/or releasing high the signal level at the single-wire interface by controlling the third field-effect transistor.

Following the communication phase there may be a further bus idle phase, in 620 (5), between communications. The host device may turn off the first field-effect transistor and the second field-effect transistor during the idle phase, so that the bus is in open drain configuration in which the pull-up resistor is used for communication and charging path. In this scenario with both the field-effect transistor (e.g., a PMOS) and the second field-effect transistor (e.g., a NMOS) being turned off, the host device may be in tristate.

In 622 (6), when there is no communication between the host device and the slave device (the second field-effect transistor and the third field-effect transistor are off), the host device may turn on the first field-effect transistor to charge the bus. In this phase, the external (charging) capacitor may be charged quickly to recover the energy lost during the communication phase (illustratively, the energy consumed by the slave device during the communication phase 618). The first field effect transistor may be switched on for a duration that is dependent on the duration of device communication phase at 618. The first field-effect transistor should be switched off after replenishing some or all of the charges lost by the external capacitor so that the bus is kept idle thus allowing the slave device to interrupt and communicate with the host device if needed.

In 624 (7), there may be a further device communication phase from the host device to the slave device. The host device may turn off the first field-effect transistor or utilize the first field-effect transistor during the communication phase. The charging path may be through the pull-up resistor in the case that the first field-effect transistor is turned off. During this phase, the host device may be planning to send (and actually send) a command to the slave device to run a high-current operation. For example, a non-volatile memory write/read operation or authentication operation that demands high current. In case the first field-effect transistor is off, the supply voltage, $V_{CC}$, will drop. During this phase, there is no communication from the slave device to the host device.

After receiving the command, the slave device may run the high-current operation, in 626 (8), like memory reading/writing or doing authentication computation. The host may turn on the first field-effect transistor to reduce the resistance impedance between the voltage supply and the single-wire interface. This may reduce the voltage drop across the voltage supply and the single-wire interface, thus providing a higher voltage margin for the bus power application. At this phase, one charging path is through the pull-up resistor and one charging path is through the first field-effect transistor. Via this control, the host device may adaptively control the bus power for the slave device depending on the current demand of the device.

After the execution of the high-current operation, the slave device, in 628 (9), may run a low-current operation or may be set into interrupt mode. The host device may turn off the first field-effect transistor and the second field-effect transistor during the low-current operation of the slave device or interrupt mode (illustratively, the host device may be in tristate). During this phase, the bus is operating in open drain configuration/bus idle mode. This allows the system to conserve power and at the same time allow the slave device to interrupt the host device by keeping the bus idle.

Figure 7:
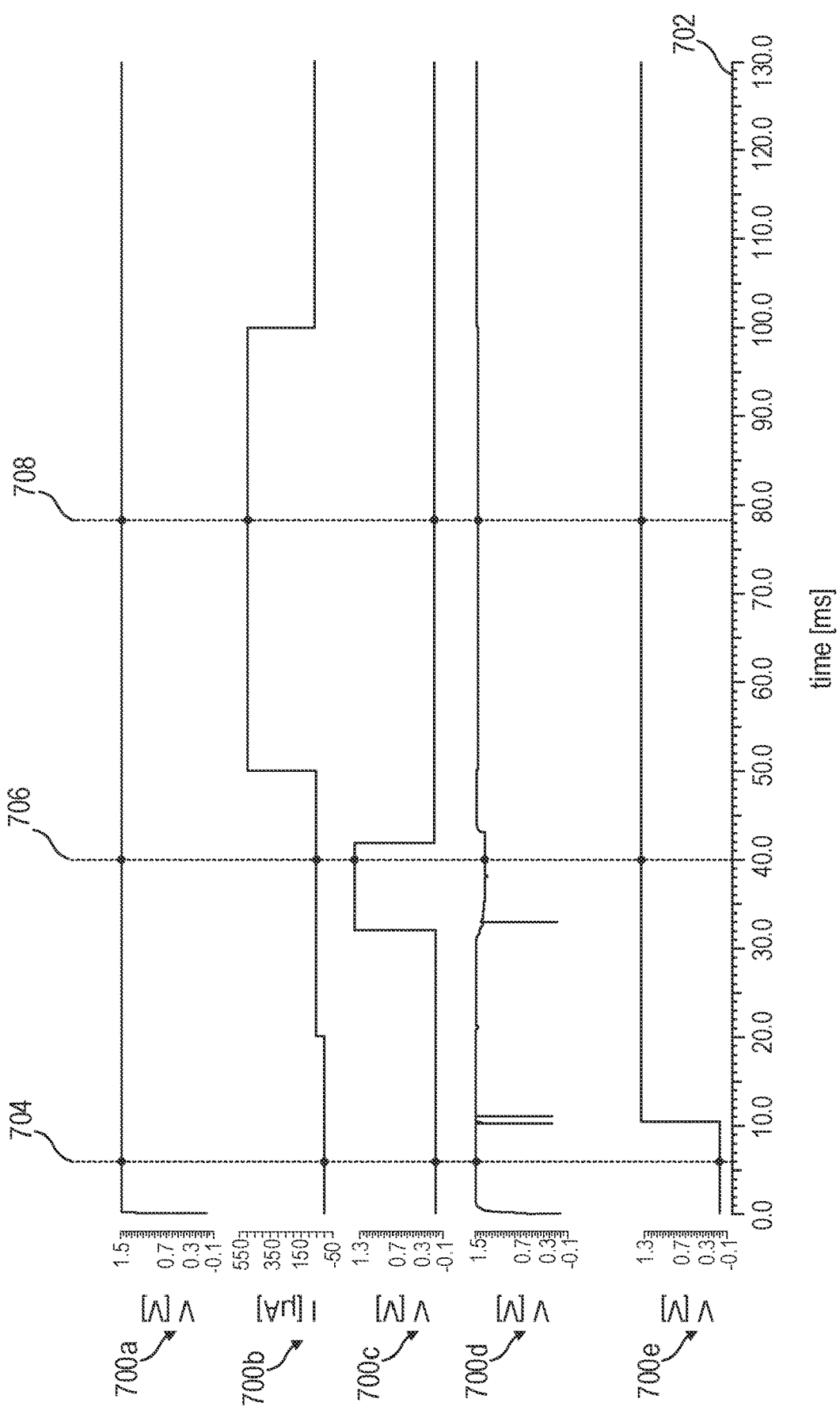
FIG. 7 shows a time diagram illustrating an operation of a system including a host device and a single-wire device, according to various aspects.

FIG. 7 shows a series of graphs 700*a*, 700*b*, 700*c*, 700*d*, 700*e* illustrating a simulation of the transient response of a system including a first device (a host device) and a second device (a slave device) connected to one another over a single-wire interface controlled in accordance with the adaptive power control described herein. The graphs 700*a*, 700*b*, 700*c*, 700*d*, 700*e* illustrate the evolution over time (indicated along the horizontal axis 702, in milliseconds, ms) of voltages and currents relevant in the system.

The first graph 700*a* shows the behavior of the supply voltage, $V_{CC}$, over time (shown in volts, V). The supply voltage may remain constant (e.g., with an exemplary value of 1.467 V) during the operation of the system. e.g. at different time points 704 (e.g., 6.0 ms), 706 (40.0 ms), 708 (78.16 ms).

The second graph 700*b* shows the behavior of the current consumed by the slave device over time (shown in microampere, μA). The slave device may be off at the beginning (0.0 μA at the first time point 704), may consume a relatively low amount of current (e.g., 50.0 μA as numerical example) for example during communication (at the second time point 706), and may consume a relatively high amount of current (e.g., 500.0 μA as numerical example) during execution of a high-current operation (at the second time point 708).

The third graph 700*c* shows the behavior of the controller (the pad control) inside the slave device. Illustratively, the third graph 700*c* shows the activation of the controller of the slave device in accordance with a data stream transmitted from the slave device to the host device. The voltage may be substantially 0 at the beginning (e.g., 672.99 nV, nanovolts, at the first time point 704, as a numerical example), and then is at a higher level (e.g., 1.19 V at the second time point 706, as a numerical example), e.g. during communication from slave to host, and then it is reduced (e.g., at 23.5 nV at the third time point 708, as a numerical example), e.g. after communication and during the high-current operation of the slave device.

The fourth graph 700*d* shows the behavior over time of the voltage (in volts, V) available at the slave device for its operation, illustratively the voltage available at the single-wire interface. At the beginning (at the first time point), the slave device may have available substantially the voltage that may be provided by the supply (e.g., 1.46 V at the first time point 704). Upon energy consumption at the slave device, the available voltage may decrease (e.g., down to 1.29 V at the second time point 706, as a numerical example). By implementing the adaptive power control described herein, sufficient voltage may be made available at the slave device (e.g., 1.40 V at the third time point 708, as a numerical example) to ensure that the slave device may carry out the high-current operation.

The fifth graph 700*e* shows the behavior over time of the voltage at the low-dropout regulator of the slave device, which is substantially 0 at the beginning (e.g., 938.13 nV, nanovolts, at the first time point 704, as a numerical example), and then is at a higher level (e.g., 1.19 V, as a numerical example), at which remains over time (e.g., at the second and third time points 706, 708). Illustratively, the fifth graph 700*e* shows that the internal LDO voltage is maintained over the whole operation.

The graphs in FIG. 7 thus illustrate that the adaptive power control may provide that if the slave device draws an increased amount of current, the system may react providing an additional charging path for the single-wire interface, thus reducing the voltage drop across the voltage supply and the single-wire interface.

Figure 8:
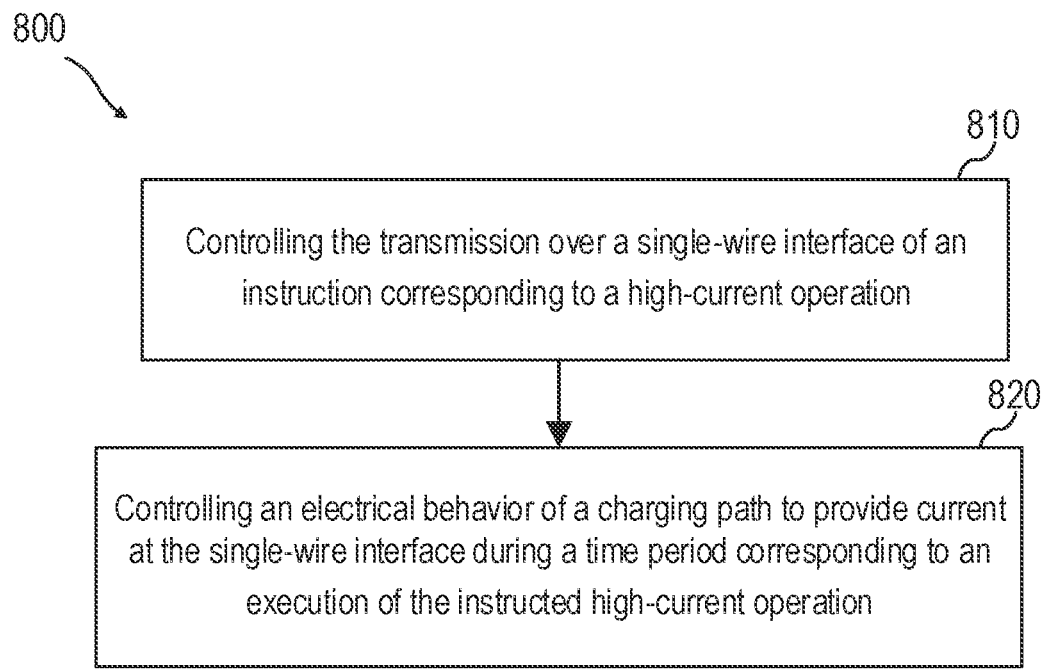
FIG. 8 shows a schematic flow diagram of a method for operating a single-wire interface, according to various aspects.

FIG. 8 shows a schematic flow diagram of a method 800 of operating a single-wire interface (e.g., for operating the single-wire interface 202), according to various aspects. In some aspects, a first (host) device and a second (slave) device (or more than one second device) may be connected to one another over the single-wire interface.

The method 800 may include, in 810, controlling the transmission over a single-wire interface of an instruction corresponding to a high-current operation. For example, controlling the transmission of the instruction may include controlling a signal level at the single-wire interface. The control of the signal level at the single-wire interface may include, for example, controlling a switchable element, e.g. a field-effect transistor, to pull-down or release high the signal level at the single-wire interface.

The method 800 may include, in 820, controlling an electrical behavior of a charging path to provide current at the single-wire interface during a time period corresponding to an execution of the instructed high-current operation. For example, controlling the electrical behavior of the charging path may include controlling a switchable element, e.g. a field-effect transistor, to connect or disconnect a charging path between a supply (e.g., a voltage supply) and the single-wire interface.

In the following, various examples are provided that may include one or more aspects described above with reference to a controller (e.g., the controller 200, 302, 406), a device (e.g., the device 300, 400, 502, 504), as system (e.g., the system 500*a*, 500*b*, 500*c*), and a method (e.g., the method 800). It may be intended that aspects described in relation to the controller/device/system may apply also to the method, and vice versa.

Example 1 is a controller configured to: control a transmission over a (e.g., bidirectional) single-wire interface of an instruction corresponding to a high-current operation; and control an electrical behavior of a charging path to provide current to the single-wire interface during a time period corresponding to an execution of the instructed high-current operation. Illustratively, the controller may be configured to control the electrical behavior of the charging path to make (more) power available at the single-wire interface. For example, the transmission of the instruction may be to a second (slave, e.g. single-wire) device connected to the single-wire interface.

In Example 2, the controller of example 1 may optionally further include that the controller is configured to control the electrical behavior of the charging path by controlling a connection between the single-wire interface and a voltage supply during the time period corresponding to the execution of the instructed high-current operation.

In Example 3, the controller of example 1 or 2 may optionally further include that the instructed high-current operation includes a non-volatile memory write/read operation or an authentication operation.

In Example 4, the controller of any one of examples 1 to 3 may optionally further include that the execution of the instructed high-current operation is associated with an expected current consumption above a predefined threshold.

In Example 5, the controller of example 4 may optionally further include that the predefined threshold is in the range from 500 µA to 5 mA, e.g. in the range from 1 mA to 2 mA.

In Example 6, the controller of any one of examples 1 to 5 may optionally further include that the controller is configured to control the transmission of the instruction over the single-wire interface by controlling a signal level (e.g., a current level or a voltage level) at the single-wire interface.

In Example 7, the controller of example 6 may optionally further include that a first signal level (e.g., a first current level or a first voltage level) at the bidirectional single-wire interface corresponds to a first logic value and that a second signal level (e.g., a second current level or a second voltage level) at the bidirectional single-wire interface corresponds to a second logic value. For example, a high voltage level or a high current level may correspond to a logic "1", and a low voltage level or a low current level may correspond to a logic "0".

In Example 8, the controller of any one of examples 1 to 7 may optionally further include that the single-wire interface is configured such that at least a portion of the current provided at the single-wire interface increases a charge of a charging capacitor connected to the single-wire interface.

Example 9 is a system including: the controller of any one of examples 1 to 8; and a charging capacitor connected to the single-wire interface, wherein the charging capacitor is configured such that a charge of the capacitor is re-built upon current being provided at the single-wire interface.

Example 10 is a (first, e.g. host) device including: the controller of any one of examples 1 to 8; a voltage supply terminal; and a first switchable element, e.g. a first field-effect transistor, coupled between the single-wire interface and the voltage supply terminal.

In Example 11, the device of example 10 may optionally further include that the controller is configured to control the electrical behavior of the charging path to provide current to the single-wire interface by providing a control signal at a first node of the first field-effect transistor to control an electrical behavior of a second node and a third node of the first field-effect transistor.

In Example 12, the device of example 11 may optionally further include that one of the second node or the third node is coupled to the single-wire interface and the other one of the second node or the third node is coupled to the voltage supply terminal, and that the charging path to provide current to the single-wire interface includes a charging path between the voltage supply terminal and the single-wire interface.

In Example 13, the device of example 12 may optionally further include that the first field-effect transistor is configured, in a first state, to allow a current flow between the second node and the third node to reduce a resistance of the charging path between the voltage supply terminal and the single-wire interface, and that the first field-effect transistor is configured, in a second state, to prevent the current flow between the second node and the third node to increase the resistance of the charging path between the voltage supply terminal and the single-wire interface.

In Example 14, the device of example 13 may optionally further include that the control signal includes a first control signal to bring the first field-effect transistor in the first state during the time period corresponding to the execution of the instructed high-current operation.

In Example 15, the device of example 14 may optionally further include that the control signal further includes a second control signal to bring the first field-effect transistor in the second state after the time period corresponding to the execution of the instructed high-current operation (illustratively, after the time period has elapsed).

In Example 16, the device of any one of examples 11 to 15 may optionally further include that the first node includes a gate node, the second node includes one of a source node or a drain node, and the third node includes the other one of the source node or the drain node.

In Example 17, the device of any one of examples 10 to 16 may optionally further include that the first field-effect transistor includes a MOSFET, e.g. one of a NMOS field-effect transistor or a PMOS field-effect transistor.

In Example 18, the device of any one of examples 10 to 17 may optionally further include a reference voltage terminal; and a second switchable element, e.g. a second field-effect transistor, coupled between the single-wire interface and the reference voltage terminal.

In Example 19, the device of example 18 may optionally further include that the controller is configured to control the signal level at the single-wire interface by providing a control signal at a first node of the second field-effect transistor to control an electrical behavior of a second node and a third node of the second field-effect transistor.

In Example 20, the device of example 19 may optionally further include that one of the second node or the third node is coupled to the single-wire interface and the other one of the second node or the third node is coupled to the reference voltage terminal.

In Example 21, the device of example 19 may optionally further include that the second field-effect transistor is configured, in a first state, to allow a current flow between the second node and the third node to connect the single-wire interface and the reference voltage terminal with one another, and that the second field-effect transistor is configured, in a second state, to prevent the current flow between the second node and the third node to disconnect the single-wire interface and the reference voltage terminal from one another.

In Example 22, the device of example 21 may optionally further include that the control signal is configured as a function of the instruction transmitted (or to be transmitted) over the single-wire interface to include one or more first control signals to bring the second field-effect transistor in the first state and/or one or more second control signals to bring the second field-effect transistor in the second state.

In Example 23, the device of any one of examples 19 to 22 may optionally further include that the first node includes a gate node, the second node includes one of a source node or a drain node, and the third node includes the other one of the source node or the drain node.

In Example 24, the device of any one of examples 18 to 23 may optionally further include that the second field-effect transistor includes a MOSFET, e.g. one of a NMOS field-effect transistor or a PMOS field-effect transistor.

In Example 25, the device of example 24 may optionally further include that the first field-effect transistor and the second field-effect transistor have opposite polarity.

Example 26 is a system including: a first device of any one of examples 11 to 25, and a second (slave, e.g. single-wire) device, wherein the first device and the second device are connected to one another over the single-wire interface.

In Example 27, the system of example 26 may optionally further include a voltage supply coupled to the voltage supply terminal of the first device.

In Example 28, the system of example 27 may optionally further include that the voltage supply is configured to supply a voltage in the range from 0.8 V to 2 V, for example in the range from 1 V to 1.5 V.

In Example 29, the system of example 27 or 28 may optionally further include a pull-up resistor coupled between the single-wire interface and the voltage supply to provide a further charging path to provide current to the single-wire interface.

In Example 30, the system of any one of examples 26 to 29 may optionally further include a reference voltage source coupled to the reference voltage terminal of the first device (and, in some aspects, to a reference voltage terminal of the second device).

In Example 31, the system of example 30 may optionally further include that the reference voltage source includes a connection to ground.

In Example 32, the system of any one of examples 26 to 31 may optionally further include that the second device is configured to carry out the instructed high-current operation in response to receiving the instruction corresponding to the high-current operation over the single-wire interface.

In Example 33, the system of example 32 may optionally further include that the second device is configured to run a low-current operation or to enter into an interrupt mode after execution of the instructed high-current operation.

In Example 34, the system of any one of examples 26 to 33 may optionally further include a charging capacitor configured to provide energy to the second device during an execution of an operation of the second device (e.g., during the execution of the instructed high-current operation, or during the execution of another operation).

In Example 35, the system of example 34 may optionally further include that the charging capacitor is configured such that a charge of the charging capacitor is re-built upon current being provided at the single-wire interface.

In Example 36, the system of any one of examples 26 to 35 may optionally further include that the second device includes a second controller configured to control a transmission over the single-wire interface of data to the first device.

In Example 37, the system of example 36 may optionally further include that the second controller is configured to control the transmission of data over the single-wire interface by controlling a signal level (e.g., a current level or a voltage level) at the single-wire interface.

In Example 38, the system of example 37 may optionally further include that the second device includes a third switchable element, e.g. a third field-effect transistor, the third field-effect transistor including a second node, a third node, and a first node to control an electrical behavior of the second node and the third node, and that the second controller is configured to control the signal level at the single-wire interface by providing a control signal at the first node of the third field-effect transistor to control the electrical behavior of the second node and the third node.

In Example 39, the system of example 38 may optionally further include that the second device includes a second voltage supply terminal, and that one of the second node or the third node of the third field-effect transistor is coupled to the single-wire interface and the other one of the second node or the third node of the third field-effect transistor is coupled to the second voltage supply terminal.

In Example 40, the system of example 38 or 39 may optionally further include that the third field-effect transistor is configured, in a first state, to allow a current flow between the second node and the third node to provide a first signal level (e.g., a first current level or a first voltage level) at the single-wire interface, and that the third field-effect transistor is configured, in a second state, to prevent the current flow between the second node and the third node to provide a second signal level (e.g., a second current level or a second voltage level) at the single-wire interface.

In Example 41, the system of example 40 may optionally further include that the first signal level at the single-wire interface corresponds to a first logic value and that the second signal level at the single-wire interface corresponds to a second logic value.

In Example 42, the system of any one of examples 37 to 41 may optionally further include that during the transmission of data from the second device to the first device over the single-wire interface, the controller of the first device is configured to bring the first field-effect transistor and the second field-effect transistor of the first device in the respective second state. Illustratively, the controller of the first device may be configured to bring the first device in a tristate during the transmission of data from the second device to the first device over the single-wire interface. Further illustratively, the controller of the second device may be configured to control (e.g., to instruct) a transmission of data from the second device to the first device over the single-wire interface in the case that the first device is in a tristate.

In Example 43, the system of any one of examples 26 to 42 may optionally further include that the first device is configured as a master device, and that the second device is configured as a slave device.

Example 44 is one or more non-transitory computer readable media storing instructions thereon that, when executed by a controller, direct the controller to execute a method of operating a single-wire interface, the method including: controlling a transmission over the single-wire interface of an instruction corresponding to a high-current operation; and controlling an electrical behavior of a charging path to provide current to the single-wire interface during a time period corresponding to an execution of the instructed high-current operation.

Example 45 is a method of operating a single-wire interface, the method including: controlling (e.g., instructing) the transmission over a single-wire interface of an instruction corresponding to a high-current operation; and controlling an electrical behavior of a charging path to provide current to the single-wire interface during a time period corresponding to an execution of the instructed high-current operation.

Example 46 is a system including: a first device including a controller; and a second device; wherein the first device and the second device are connected to one another over a single-wire interface; and wherein the controller is configured to control a transmission over the single-wire interface from the first device to the second device of an instruction corresponding to a high-current operation; and control an electrical behavior of a charging path to provide current to the single-wire interface during a time period corresponding to an execution of the instructed high-current operation.

While the invention has been particularly shown and described with reference to specific aspects, it should be understood by those skilled in the art that various changes in form and detail may be made therein without departing from the scope of the invention as defined by the appended claims.

LIST OF REFERENCE SIGNS

100 Single-wire System
102 Host device
104 Single-wire device
106 Single-wire connection
106h Conductive element
106d Conductive element
108 Substrate
110 Substrate
112 Supply terminal
114 Input/output terminal
116 Ground terminal
118 Supply terminal
120 Input/output terminal
122 Ground terminal
124 Ground connection
124h Conductive element
124d Conductive element
126 Pull-up resistor
128 Capacitor
130 Diode
200 Controller
202 Single-wire interface
204 Transmission
206 Control
300 Device
302 Controller
304 Single-wire interface
306 First terminal
308 Second terminal
310 Switchable element
312d Drain node
312g Gate node
312s Source node
314 Third terminal
316 Switchable element
318d Drain node
318g Gate node
318s Source node
400 Single-wire device
402 Single-wire interface
404 First terminal
406 Controller
408 Second terminal
410 Switchable element
412d Drain node
412g Gate node
412s Source node
500a System
500b System
500c System
502 First device
504 Second device
506 Single-wire interface
508 Single-wire connection
510 Supply
512 Pull-up resistor
514 Reference supply
516 Capacitor
518 Third terminal
520 Host device
522 Single-wire device
524 Single-wire interface
526 Single-wire connection
528 Terminal
530 Terminal
532 Voltage supply
534 Pull-up resistor
536 Terminal
538 Reference supply
540 Terminal
542 Terminal
544 Charging capacitor
546 Terminal
548 Controller
550 MOSFET
552 MOSFET
554 Controller
556 MOSFET
558 Configuration controller
560 Configuration terminal
562 MOSFET
564 Diode
566 Low-dropout regulator
600 Time diagram
602 Line
604 Line
606 Line
610 Time period
612 Time period
614 Time period
616 Time period
618 Time period
620 Time period
622 Time period
624 Time period
626 Time period
628 Time period
700a Graph
700b Graph
700c Graph
700d Graph
700e Graph
702 Horizontal axis
704 Time point
706 Time point
708 Time point
800 Method
810 Method step
820 Method step

What is claimed is:

1. A controller comprising analog and/or digital circuitry configured to:
control a transmission over a single-wire interface of an instruction corresponding to a high-current operation;
control an electrical behavior of a charging path to provide current at the single-wire interface during a time period corresponding to an execution of the instructed high-current operation; and control the electrical behavior of the charging path to provide current at the single-wire interface by providing a control signal at a first node of a first field-effect transistor to control an electrical behavior of a second node and a third node of the first field-effect transistor.

2. The controller of claim 1, wherein the analog and/or digital circuitry is configured to control the electrical behavior of the charging path by controlling a connection between the single-wire interface and a voltage supply during the time period corresponding to the execution of the instructed high-current operation.

3. The controller of claim 1, wherein the instructed high-current operation comprises a non-volatile memory write/read operation or an authentication operation.

4. The controller of claim 1, wherein the execution of the instructed high-current operation is associated with an expected current consumption above a predefined threshold.

5. The controller of claim 1, wherein the analog and/or digital circuitry is configured to control the transmission of the instruction over the single-wire interface by controlling a signal level at the single-wire interface.

6. The controller of claim 1, wherein the single-wire interface is configured such that at least a portion of the current provided at the single-wire interface increases a charge of a charging capacitor connected to the single-wire interface.

7. A device, comprising:
the controller of claim 1; and
a voltage supply terminal,
wherein the first field-effect transistor is coupled between the single-wire interface and the voltage supply terminal.

8. The device of claim 7,
wherein one of the second node or the third node is coupled to the single-wire interface and the other one of the second node or the third node is coupled to the voltage supply terminal, and
wherein the charging path to provide current at the single-wire interface comprises a charging path between the voltage supply terminal and the single-wire interface.

9. The device of claim 8,
wherein the first field-effect transistor is configured, in a first state, to allow a current flow between the second node and the third node to reduce a resistance of the charging path between the voltage supply terminal and the single-wire interface, and
wherein the first field-effect transistor is configured, in a second state, to prevent the current flow between the second node and the third node to increase the resistance of the charging path between the voltage supply terminal and the single-wire interface.

10. The device of claim 9,
wherein the control signal comprises a first control signal to bring the first field-effect transistor into the first state during the time period corresponding to the execution of the instructed high-current operation.

11. A system, comprising:
a first device configured according to claim 7; and
a second device,
wherein the first device and the second device are connected to one another over the single-wire interface.

12. The system of claim 11, further comprising:
a charging capacitor configured to provide energy to the second device during an execution of an operation of the second device,
wherein the charging capacitor is configured such that a charge of the charging capacitor is re-built upon current being provided at the single-wire interface.

13. A computer program product comprising one or more non-transitory computer readable media storing a computer program operable, when executed by a controller, to direct the controller to execute a method of operating a single-wire interface, the computer program comprising:
program instructions to control a transmission over the single-wire interface of an instruction corresponding to a high-current operation;
program instructions to control an electrical behavior of a charging path to provide current at the single-wire interface during a time period corresponding to an execution of the instructed high-current operation; and
program instruction to control the electrical behavior of the charging path to provide current at the single-wire interface by providing a control signal at a first node of a first field-effect transistor to control an electrical behavior of a second node and a third node of the first field-effect transistor.

14. A method of operating a single-wire interface, the method comprising:
controlling a transmission over the single-wire interface of an instruction corresponding to a high-current operation;
controlling an electrical behavior of a charging path to provide current at the single-wire interface during a time period corresponding to an execution of the instructed high-current operation; and
controlling the electrical behavior of the charging path to provide current at the single-wire interface by providing a control signal at a first node of a first field-effect transistor to control an electrical behavior of a second node and a third node of the first field-effect transistor.

15. A controller comprising analog and/or digital circuitry configured to:
control a transmission over a single-wire interface of an instruction corresponding to a high-current operation and of an instruction corresponding to a low-current operation; and
in response to an expected current consumption that is above or below a predefined threshold, adaptively control an amount of power available at the single-wire interface by controlling an electrical behavior of a charging path to provide more current at the single-wire interface during a time period corresponding to an execution of the instructed high-current operation and less current during a time period corresponding to an execution of the instructed low-current operation.

16. The controller of claim 15,
wherein the instructed high-current operation is associated with an expected current consumption above a first predefined threshold, and
wherein the instructed low-current operation is associated with an expected current consumption less than a second predefined threshold.

17. The controller of claim 16,
wherein the first predefined threshold is in a range of 500 µA to 5 mA, and wherein the second predefined threshold is in a range of 10 µA to 300 µA.

18. The controller of claim 15,
wherein the analog and/or digital circuitry is configured to operate the single-wire interface in an open drain configuration/bus idle mode during the time period corresponding to the execution of the instructed low-current operation.

* * * * *